United States Patent [19]
Kume et al.

[11] Patent Number: 5,923,690
[45] Date of Patent: *Jul. 13, 1999

[54] SEMICONDUCTOR LASER DEVICE

[75] Inventors: Masahiro Kume, Shiga-ken; Yuuzaburou Ban, Osaka; Akihiko Ishibashi, Osaka; Nobuyuki Uemura, Osaka; Hidemi Takeisi, Fukuoka-ken; Isao Kidoguchi, Hyogo-ken, all of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/788,511

[22] Filed: Jan. 24, 1997

[30] Foreign Application Priority Data

Jan. 25, 1996 [JP] Japan ................... 8-010556
Jan. 25, 1996 [JP] Japan ................... 8-010558
Jan. 25, 1996 [JP] Japan ................... 8-010560
Jan. 31, 1996 [JP] Japan ................... 8-014946
Feb. 1, 1996 [JP] Japan ................... 8-016322

[51] Int. Cl.$^6$ ........................................ H01S 3/19
[52] U.S. Cl. ................. 372/46; 372/49; 372/50; 372/45; 257/94
[58] Field of Search ................. 372/46, 49, 45, 372/50; 257/94, 96, 103

[56] References Cited

U.S. PATENT DOCUMENTS

| | | | |
|---|---|---|---|
| 4,435,443 | 3/1984 | Imai et al. ........................... | 427/38 |
| 4,761,707 | 8/1988 | Wakamatsu et al. ................ | 361/127 |
| 5,042,043 | 8/1991 | Hatano et al. ....................... | 372/45 |
| 5,243,204 | 9/1993 | Suzuki et al. ........................ | 257/77 |
| 5,452,315 | 9/1995 | Kimura et al. ....................... | 372/45 |
| 5,583,881 | 12/1996 | Uchida et al. ....................... | 372/49 |
| 5,585,649 | 12/1996 | Ishikawa et al. .................... | 257/94 |
| 5,587,334 | 12/1996 | Naito et al. .......................... | 437/129 |
| 5,656,832 | 8/1997 | Ohba et al. ........................... | 257/190 |
| 5,787,104 | 7/1998 | Kamiyama et al. .................. | 372/43 |

FOREIGN PATENT DOCUMENTS

| | | |
|---|---|---|
| 62-73687 | 4/1987 | Japan . |
| 7-162038 | 6/1995 | Japan . |
| 8-97502 | 4/1996 | Japan . |

Primary Examiner—Rodney Bovernick
Assistant Examiner—Ellen E. Kang
Attorney, Agent, or Firm—Ratner & Prestia

[57] ABSTRACT

A gallium nitride group compound semiconductor laser device of the present invention includes: a substrate; and a layered structure provided on the substrate, wherein the layered structure includes an $In_zGa_{1-z}N$ active layer ($0 \leq z \leq 1$) which is formed at least in a first region, an n-type $Al_xGa_{1-x}N$ cladding layer ($0 \leq x \leq 1$) and a p-type $Al_yGa_{1-y}N$ cladding layer ($0 \leq y \leq 1$) interposing the active layer therebetween, and a current-defining structure made of $Al_uGa_{1-u}N$ ($0 \leq u \leq 1$) having an opening corresponding to the first region for defining a current within the first region.

23 Claims, 14 Drawing Sheets

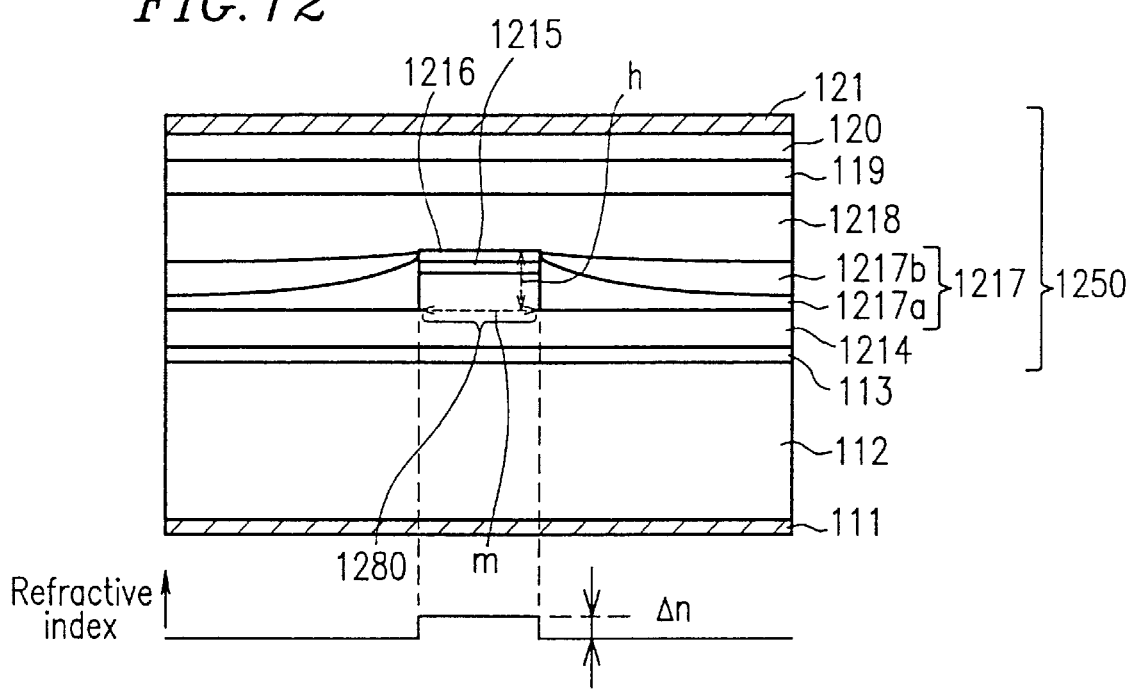

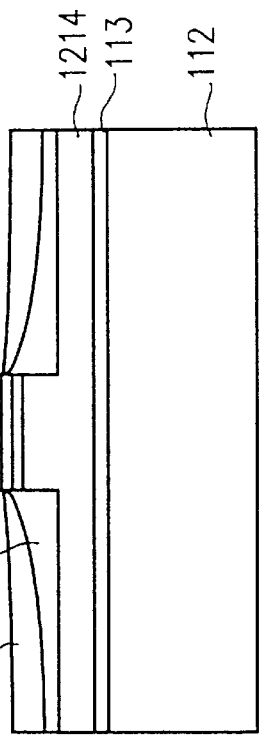
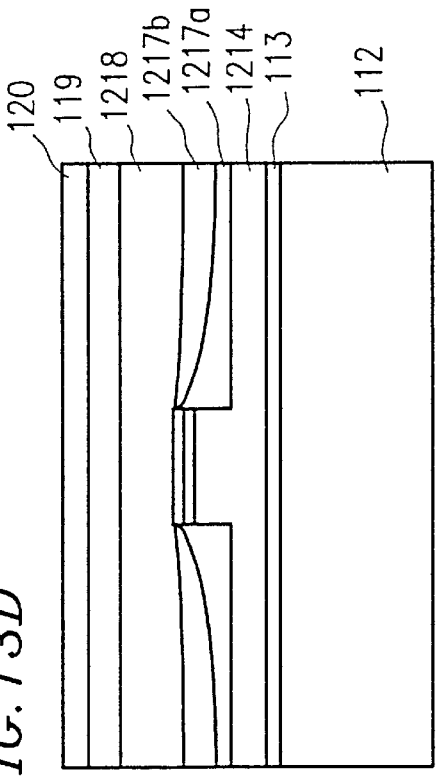
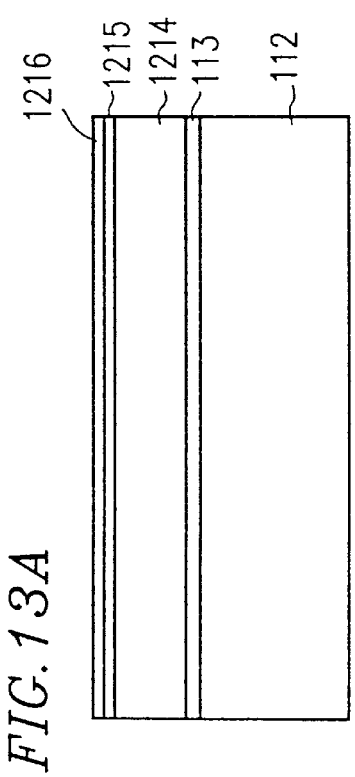
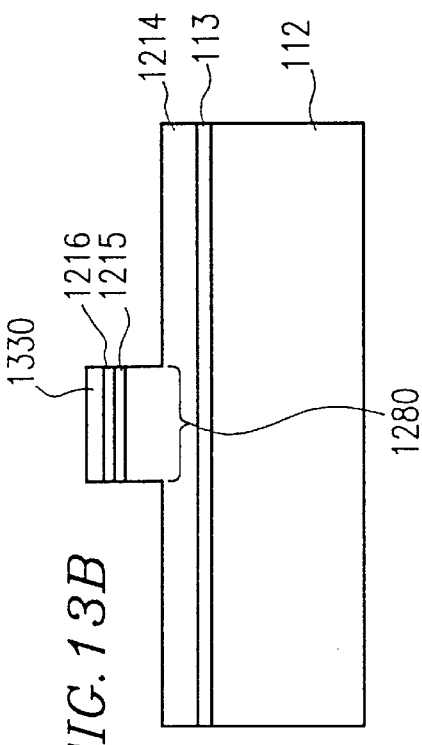
FIG. 13A
FIG. 13B
FIG. 13C
FIG. 13D

SEMICONDUCTOR LASER DEVICE

BACKGROUND OF THE INVENTION

1. Field of the Invention

The present invention relates to a semiconductor laser device used for optical information processing apparatuses such as an optical disk and a laser printer.

2. Description of the Related Art

The density of the data recorded onto an optical disk becomes higher as the spot size of a light beam focused onto the optical disk becomes smaller. Since the spot size of the light beam is proportional to a light wavelength raised to the power of 2, an oscillation wavelength of a semiconductor laser device serving as a light source should be shortened in order to increase the density of data recorded onto the optical disk. Therefore, great interest has occurred in the reduction in the wavelength of light emitted from a semiconductor laser device. At present, a GaAlAs semiconductor laser device emitting light having a wavelength of 780 nm (infrared) is utilized in a compact disc (CD). An InGaAlP semiconductor laser device emitting light having a wavelength of a 650 nm (red) is utilized in a digital versatile disc (DVD) on which data is recorded at a higher density than in a CD. To further increase a density of data recorded onto a DVD so as to record a high-quality image, a semiconductor laser device emitting light in the blue region is required. Gallium nitride group compound semiconductors have received much attention as semiconductor materials to realize such a semiconductor laser device.

With reference to FIG. 18, a conventional gallium nitride group compound semiconductor light-emitting element (disclosed in Japanese Laid-Open Patent Publication No. 7-162038) will be described. This light emitting element will be fabricated as follows. First, trimethyl gallium (TMG) and $NH_3$ are supplied at about 500° C. by a metalorganic vapor phase epitaxy (MOVPE) so as to deposit a GaN layer 161 onto a sapphire substrate 160. Next, after raising the substrate temperature to about 1000° C., trimethyl aluminum (TMA) and $SiH_4$ (monosilane) are additionally supplied so as to deposit an n-type AlGaN cladding layer 162 onto the GaN layer 161. Next, after lowering a substrate temperature to about 700° C., trimethyl indium (TMI), TMG and $NH_3$ are supplied so as to deposit an InGaN active layer 163 onto the n-type AlGaN cladding layer 162. Thereafter, after raising a substrate temperature to about 1000° C. again, TMA, TMG, cyclopentadienyl magnesium ($Cp_2Mg$), and $NH_3$ are supplied so as to deposit a p-type AlGaN cladding layer 164 onto the InGaN active layer 163.

Next, part of the n-type GaN layer 161, the n-type AlGaN cladding layer 162, the InGaN active layer 163 and the p-type AlGaN cladding layer 164 is selectively dry etched until part of the n-type GaN layer 161 is exposed. As the final step, an n-side electrode 165 is formed on the exposed surface of the n-type GaN layer 161, while a p-side electrode 166 is formed on the p-type AlGaN cladding layer 164.

The light-emitting element described above is a light-emitting diode (LED). Since the light-emitting diode does not have a light confinement structure, the light-emitting diode cannot induce laser oscillation by itself. In order to induce laser oscillation, a resonator should be provided. Normally, a crystal plane, which is formed by cleavage or etching and then processed into a flat mirror, is used as the resonator. Since the refractive index of a gallium nitride semiconductor is about 2.8, a reflectance of the mirror formed by using a gallium nitride semiconductor crystal plane is low, i.e., about 22%. Accordingly, a threshold current of laser oscillation becomes disadvantageously high.

SUMMARY OF THE INVENTION

A gallium nitride group compound semiconductor laser device of the present invention includes: a substrate; and a layered structure provided on the substrate, wherein the layered structure includes an $In_zGa_{1-z}N$ active layer ($0 \leq z \leq 1$) which is formed at least in a first region, an n-type $Al_xGa_{1-x}N$ cladding layer ($0 \leq x \leq 1$) and a p-type $Al_yGa_{1-y}N$ cladding layer ($0 \leq y \leq 1$) interposing the active layer therebetween, and a current-defining structure made of $Al_uGa_{1-u}N$ ($0 \leq u \leq 1$) having an opening corresponding to the first region for defining a current within the first region.

According to another aspect of the invention, a gallium nitride group compound semiconductor laser device includes: a substrate; and a layered structure formed on the substrate, wherein the layered structure has a first region and a second region in a plane parallel to a surface of the substrate, and includes an $In_zGa_{1-z}N$ active layer ($0 \leq z \leq 1$) which is formed at least in the first region, an n-type $Al_xGa_{1-x}N$ cladding layers ($0 \leq x \leq 1$) and a p-type $Al_yGa_{1-y}N$ cladding layer ($0 \leq y \leq 1$) interposing the active layer therebetween, and a current-defining structure made of $Al_uGa_{1-u}N$ ($0 \leq u \leq 1$) having an opening corresponding to the first region for defining a current within the first region, and wherein an effective refractive index of the first region is higher than that of the second region, and a difference between the effective refractive index of the first region and the effective refractive index of the second region falls within the range of about 0.003 to about 0.02.

Thus, the invention described herein makes possible the advantage of providing a gallium nitride group compound semiconductor laser device having a configuration capable of confining light in a direction parallel to an active layer, a mirror serving as a resonator having a high reflectance, and a low threshold current value of laser oscillation.

This and other advantages of the present invention will become apparent to those skilled in the art upon reading and understanding the following detailed description with reference to the accompanying figures.

BRIEF DESCRIPTION OF THE DRAWINGS

FIG. 12 is a cross-sectional view showing the configuration of a semiconductor laser device of Example 3.

FIGS. 13A to 13D are cross-sectional views showing the steps of fabricating the semiconductor laser device of Example 3 according to the present invention.

DESCRIPTION OF THE PREFERRED EMBODIMENTS

Figure 1A:
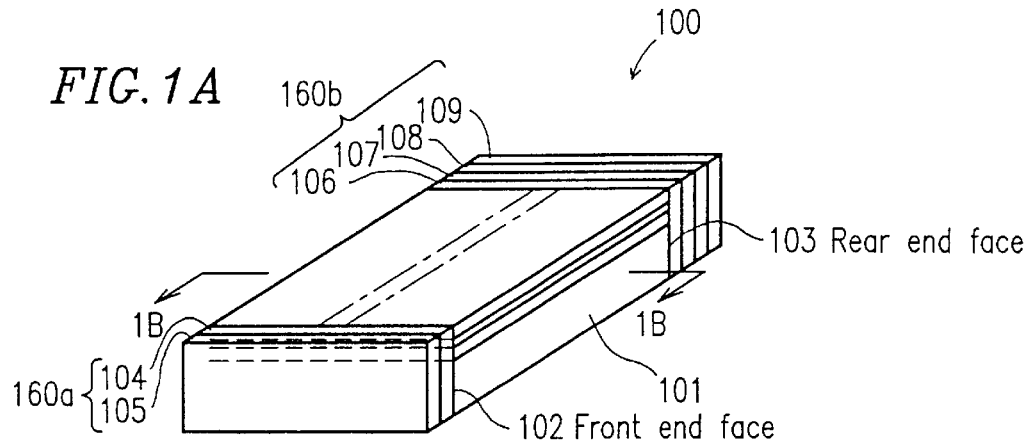
FIG. 1A is a perspective view showing an exemplary semiconductor laser device according to the present invention.

Hereinafter, the present invention will be described in detail by way of illustrative examples. In the specification of the present application, the "gallium nitride group compound semiconductor" includes: a gallium nitride (GaN) group semiconductor in which part of or the whole of Ga is replaced by another Group III element, for example, $In_sGa_{1-s}N$ ($0 \leq s \leq 1$) and $Al_tGa_{1-t}N$ ($0 \leq t \leq 1$); a semiconductor in which part of each constituent atom is replaced by a dopant atom; and a semiconductor doped with another impurity. $In_sGa_{1-s}N$ and $Al_tGa_{1-t}N$ are abbreviated as "InGaN" and "AlGaN", respectively.

In the gallium nitride group compound semiconductor laser device according to the present invention, the following three methods are employed to confine light within a selected region of an active layer in a direction parallel to the active layer.

According to the first method, an n-type currentdefining layer having an opening is provided in a p-type cladding layer. Owing to the n-type current-defining layer, a current is allowed to flow in the selected region of the active layer. In addition, a difference in refractive index is generated in the direction parallel to the active layer. The difference in refractive index is preferably in the range of about 0.003 to about 0.02 because oscillation occurs in a high-order mode if the difference in refractive index is too large. Conversely, light is not effectively confined within the active layer if the difference is too small.

There are two methods for generating a refractive index difference. According to the first method, an AlGaN layer having a higher Al molar fraction than that of the p-type AlGaN cladding layer is used as an n-type current-defining layer so as to make a refractive index of the n-type current-defining layer smaller than that of the p-type cladding layer. According to a second method, a semiconductor layer having a band gap smaller than that of the active layer is used as a current-defining layer because a current-defining layer is allowed to absorb a laser light beam. For example, in the case where an $In_aGa_{1-a}N$ ($0 \leq a \leq 1$) layer is used as the active layer, an $In_bGa_{1-b}N$ ($0 \leq a < b \leq 1$) layer having a band gap smaller than that of the $In_aGa_{1-a}N$ layer is used as the current-defining layer.

According to the second method, a width of the active layer is reduced, and an n-type buried layer and a p-type buried layer are provided under the p-type cladding layer. By providing the n-type buried layer and the p-type buried layer, a current is allowed to flow only through the active layer. Moreover, by determining a refractive index so as to be smaller than that of the active layer, the difference in refractive index is generated in a direction parallel to the active layer. For the same reason as described above, the difference in the refractive index is preferably in the range of about 0.003 to about 0.02.

According to the third method, a stripe-shaped ridge is formed in a selected region of the p-type cladding layer, and the n-type burying layers are then provided on both sides of the ridge. The bottom of the ridge does not reach the active layer. With this configuration, a current is allowed to flow through the selected region of the active layer. In addition, a difference in refractive index is generated in a direction parallel to the active layer. For the same reason as described above, the difference in refractive index is preferably in the range of about 0.003 to about 0.02.

There are two methods for generating the difference in refractive index. According to the first method, an AlGaN layer having a higher Al molar fraction than that of the p-type AlGaN cladding layer is used as an n-type buried layer so as to make a refractive index of the n-type burying layer smaller than that of the p-type cladding layer. According to another method, by using a semiconductor layer, having a band gap smaller than that of the active layer, as the burying layer, the buried layer is able to absorb the laser light beam. For example, in the case where an $In_aGa_{1-a}N$ ($0 \leq a \leq 1$) layer is used as the active layer, an $In_bGa_{1-b}N$ ($0 \leq a < b \leq 1$) layer, having a band gap smaller than that of the $In_aGa_{1-a}N$ layer, is used as the burying layer.

In order to increase the reflectance of the mirror serving as a resonator, a multi-layered structure including two or more layers, in which a film made of $Al_2O_3$ or $SiO_2$ and a film made of $TiO_2$ or diamond are deposited in an alternate manner, is provided on each end face of a laser element. The $Al_2O_3$ film and the $SiO_2$ film have a refractive index of about 1.5. The $TiO_2$ film and the diamond film have a refractive index of about 2 or higher. Each of the films is made of a dielectric material which is transparent with respect to a laser light beam, and has a thickness of about one-fourth of the oscillation wavelength.

EXAMPLE 1

Figure 1B:
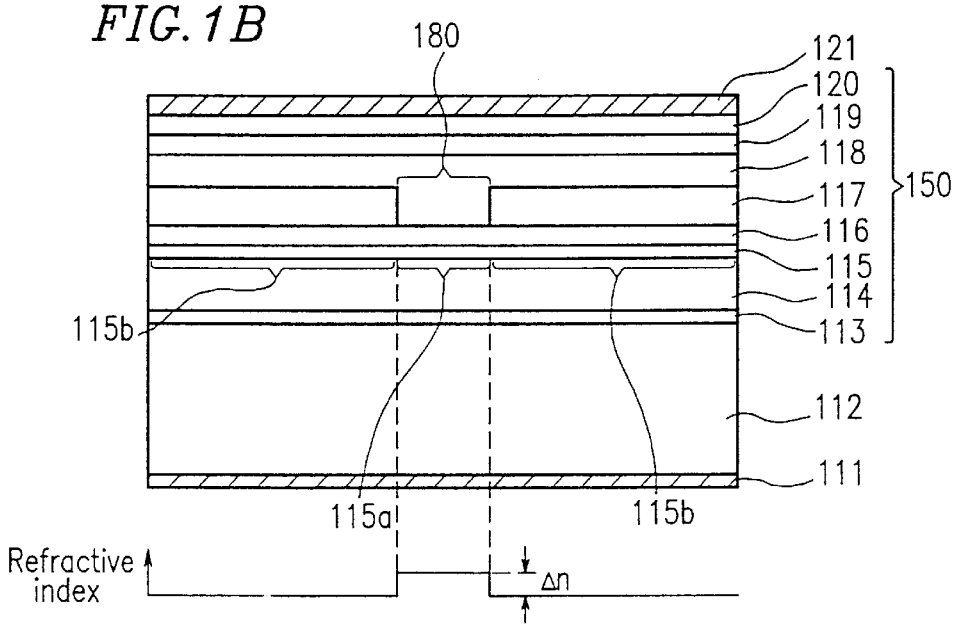
FIG. 1B is a cross-sectional view taken along a line 1B—1B in FIG. 1A.

With reference to FIGS. 1A and 1B, a semiconductor laser apparatus of Example 1 according to the present invention will be described.

FIG. 1A is a perspective view showing a semiconductor laser device of Example 1. As shown in FIG. 1A, the semiconductor laser device 100 includes a layered structure body 101 and a resonator 160 consisting of a front part 160a and a rear part 160b. The layered structure 101 has a front end face 102 and a rear end face 103, on which the front part 160a and the rear part 160b are respectively formed. A laser light beam is output from the front end face 102.

The front part 160a of the resonator 160 includes a dielectric film 104 made of $Al_2O_3$ or $SiO_2$ (having a thickness of about one-fourth of the oscillation wavelength) in contact with the front end face 102 and a dielectric film 105 made of $TiO_2$ or diamond (having a thickness of about one-fourth of the oscillation wavelength). The rear part 160b of the resonator 160 includes a dielectric film 106 made of $Al_2O_3$ or $SiO_2$ (having a thickness of about one-fourth of the oscillation wavelength) in contact with the rear end face 103, dielectric films 106 and 108 made of $Al_2O_3$ or $SiO_2$ (having a thickness of about one-fourth of the oscillation wavelength) and dielectric films 107 and 109 made of $TiO_2$ or diamond (having a thickness of about one-fourth of the oscillation wavelength).

The number of dielectric films provided on the front end face 102 is larger than that provided on the rear end face 103 because a reflectance at the rear end face 103 is generally required to be higher than that of the front end face 102 from which light is externally output.

FIG. 1B is a cross-sectional view taken along line 1B—1B in FIG. 1A, schematically showing the structure of the layered structure body 101 of Example 1. As shown in FIG. 1B, the layered structure body 101 includes a substrate 112, a semiconductor layered structure 150 formed on the substrate 112, and a pair of electrodes 111 and 121 for supplying the current (a driving current) that is required for emission of light.

As for the substrate 112, an n-type SiC substrate inclined at about 3.5 degrees from a (0001) plane in a [11–20] direction is used.

Hereinafter, the structure of the semiconductor layered structure 150 will be described in detail.

The semiconductor layered structure 150 includes (from the layer closest to the substrate 112 to the layer furthest therefrom): an n-type AlN buffer layer 113 (thickness: about 100 nm); an n-type $Al_xGa_{1-x}N$ cladding layer ($0 \leq x \leq 1$) 114 (thickness: about 1 μm); an $In_zGa_{1-z}N$ active layer ($0 \leq z \leq 1$) 115 (thickness: about 50 nm); a p-type $Al_yGa_{1-y}N$ first cladding layer ($0 \leq y \leq 1$) 116 (thickness: about 0.2 μm); an n-type $Al_uGa_{1-u}N$ current-defining layer ($0 \leq u \leq 1$) 117 (thickness: about 0.7 μm); a p-type $Al_vGa_{1-v}N$ second cladding layer ($0 \leq v \leq 1$) 118 (thickness on the n-type $Al_uGa_{1-u}N$ current-defining layer: about 0 to 0.5 μm); a p-type GaN cap layer 119 (thickness: about 0.5 μm); and a p-type GaN contact layer 120 (thickness: about 0.5 μm; impurity concentration: about $1 \times 10^{18}/cm^3$ or more). Si is used as an impurity for the n-type layers, and Mg is used as an impurity for the p-type layers. The p-cladding layer of the present invention includes the p-type first cladding layer 116 and the p-type second cladding layer 118.

As the molar fraction x of Al in the n-type $Al_xGa_{1-x}N$ cladding layer ($0 \leq x \leq 1$) 114 becomes greater, an energy gap of AlGaN becomes greater and the refractive index becomes smaller. The molar fraction x of Al in the n-type $Al_xGa_{1-x}N$ cladding layer 114 is determined in accordance with a molar fraction z of In in the $In_zGa_{1-z}N$ active layer 115. The molar fraction z of In in the $In_zGa_{1-z}N$ active layer 115 is adjusted in accordance with a desired oscillation wavelength. Therefore, the molar fraction x of Al in the n-type $Al_xGa_{1-x}N$ cladding layer 114 is determined in accordance with a desired oscillation wavelength. In the case where an oscillation wavelength is set within the about 410 nm (violet) wavelength range, z is about 0.15. Accordingly, the molar fraction x is determined to be between about 0.1 and 0.2.

The n-type AlGaN current-defining layer 117 has an opening 180 for defining a current within the selected region (a stripe-shaped region extending in the direction along the length of the resonator in this example) of the InGaN active layer 115. The width of the stripe-shaped opening 180 is determined so as to adjust a lateral mode of laser oscillation. In Example 1, the width of the opening 180 is in the range of about 1 to 10 μm. Part of the p-type $Al_yGa_{1-y}N$ first cladding layer 116 is exposed through the opening 180. The p-type AlGaN second cladding layer 118 is formed in the opening 180 and on the n-type AlGaN current-defining layer 117.

A p-side electrode (Ni/Au) 121 is formed on the upper surface of the p-type GaN contact layer 120, and an n-side electrode 111 (Ti/Au) is formed on the bottom face of the substrate 112.

A voltage is supplied from a current supplying circuit (not shown) to the electrodes 111 and 121, such that a current flows from the p-type electrode 121 to the n-type electrode 111 through the semiconductor layered structure 150. At this time, since the current is blocked by the n-type AlGaN current-defining layer 117, a current is defined to flow downward through the opening 180 formed in the n-type AlGaN current-defining layer 117. As a result of this, a current flows only through the portion of the InGaN active layer 115 corresponding to the opening 180. A current is defined within the selected region of the InGaN active layer 115 by providing the n-type AlGaN current-defining layer 117, such that controlled laser oscillation in a lateral mode occurs. As a result, a semiconductor laser device with a low threshold current density can be obtained.

Hereinafter, a mechanism in which a laser light beam is confined within the selected region of the active layer will be described.

Figure 2:
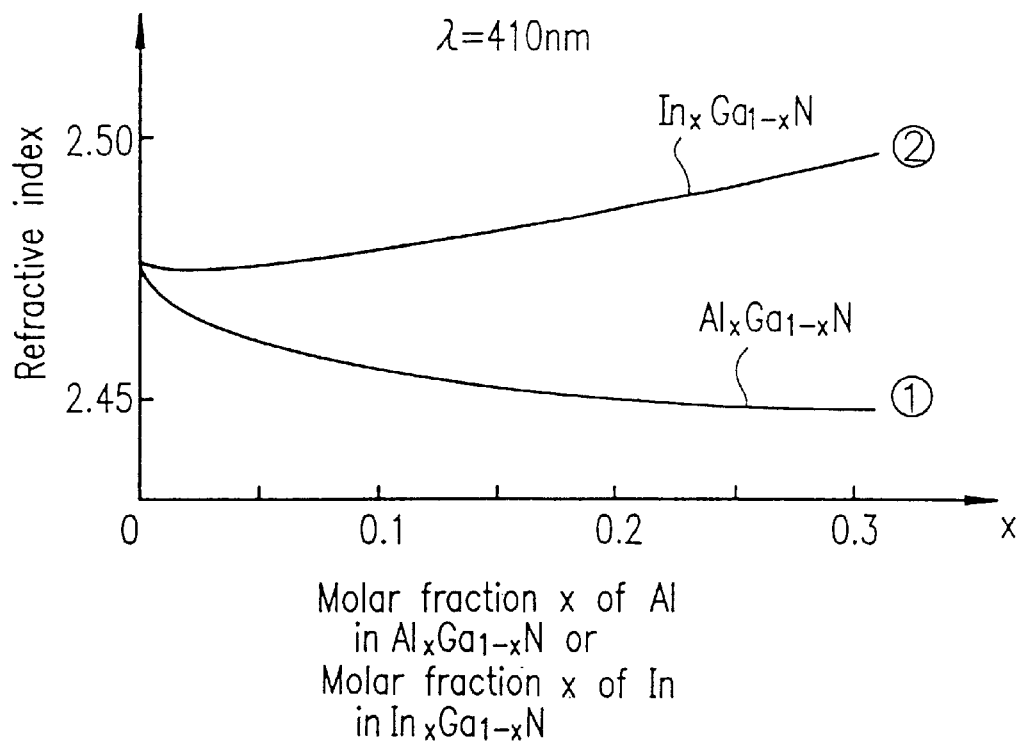
FIG. 2 is a graph showing the relationship between a molar fraction x of Al in $Al_xGa_{1-x}N$ and a refractive index of $Al_xGa_{1-x}N$ and the relationship between a molar fraction x of In in $In_xGa_{1-x}N$ and a refractive index of $In_xGa_{1-x}N$.

FIG. 2 shows the relationship between the molar fraction x of Al in $Al_xGa_{1-x}N$ and a refractive index of $Al_xGa_{1-x}N$ and the relationship between the molar fraction x of In in $In_xGa_{1-x}N$ and a refractive index of $In_xGa_{1-x}N$ in the case where light, having a wavelength of 410 nm, is used. As shown in FIG. 2, regarding $Al_xGa_{1-x}N$ (curve ①), a refractive index of $Al_xGa_{1-x}N$ decreases as the molar fraction x of Al increases. On the other hand, in the case of $In_xGa_{1-x}N$ (curve ②), a refractive index of $In_xGa_{1-x}N$ increases as the molar fraction x of In increases. On the basis of this fact, in the present invention, a molar fraction u of Al in the n-type $Al_uGa_{1-u}N$ current-defining layer 117 is determined so as to be greater than a molar fraction y of Al in the p-type $Al_yGa_{1-y}N$ first cladding layer 116 and a molar fraction v of Al in the p-type $Al_vGa_{1-v}N$ second cladding layer 118 (that is, u>y, v), so that a refractive index of the current-defining layer 117 is smaller than those of the first cladding layer 116 and the second cladding layer 118.

By controlling the molar fraction of Al as described above, a difference in refractive index (hereinafter, also referred to as "refractive index difference") is generated between the current-defining layer 117, and the first cladding layer 116 and the second cladding layer 118. As a result, a refractive index difference (effective refractive index difference) Δn is generated between an active layer 115a (first region) located just below the opening 180 and active layers 115b (second region) located below the n-type $Al_uGa_{1-u}N$ current-defining layers 117. In the specification of the present application, an "effective refractive index in the active layer" represents a refractive index which is actually experienced by light propagating through the active layer, and is determined based on the refractive index of the active layer and the layer in the vicinity thereof. Therefore, even if the active layer itself does not have a physical refractive index difference, it is possible to allow light to behave in the active layer in such a manner that the active layer itself has a refractive index difference when the effective refractive index difference is generated by the effect from the vicinity of the active layer. Owing to the effective refractive index difference Δn, light is confined within the active layer 115 in a direction parallel to the active layer 115, thereby achieving the index-guide. As a result, a laser light beam, free from aberration, can be obtained.

An effective refractive index difference Δn of the InGaN active layer 115 is also affected by the width of the opening 180. In the case where the width of the opening 180 is in the range of about 1 to 8 μm, an effective refractive index difference Δn between the active layer 115a located just below the opening 180 and the active layers 115b located below the n-type $Al_uGa_{1-u}N$ current-defining layers 117 is preferably between about 0.003 to 0.02. In order to obtain the effective refractive index difference Δn in the range of about 0.003 to 0.02 in the InGaN active layer 115, it is sufficient to generate a refractive index difference in the range of about 0.003 to 0.02 in a direction parallel to the InGaN active layer 115. That is, between the n-type $Al_uGa_{1-u}N$ current-defining layers 117 and the p-type $Al_yGa_{1-y}N$ cladding layers 118 and 116. As described above, the refractive index difference can be controlled by appropriately determining the molar fraction (u or y) of Al in these semiconductor layers.

Figure 3:
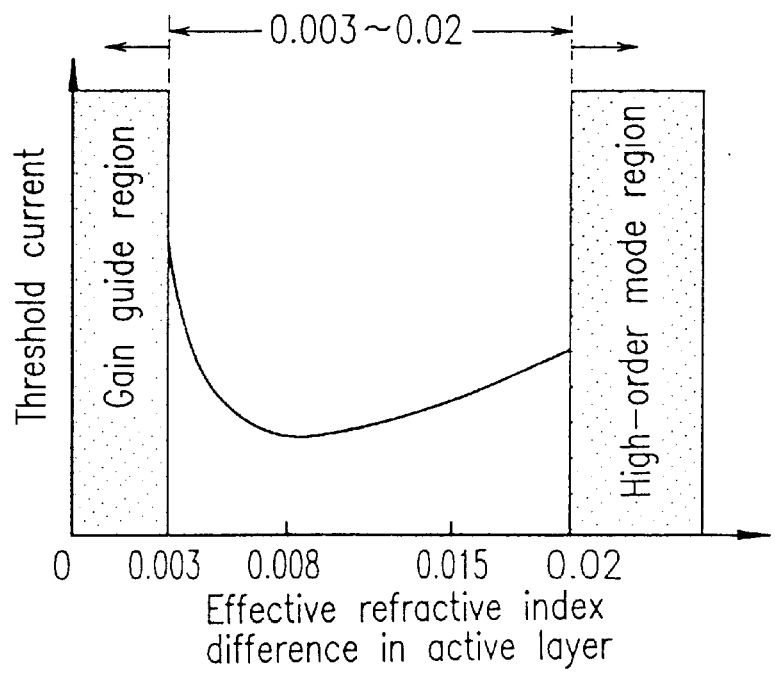
FIG. 3 is a view showing the relationship between a refractive index difference in a direction parallel to an InGaN active layer and a threshold current.

FIG. 3 shows the relationship between a refractive index difference, in a direction parallel to the InGaN active layer, and a threshold current. As shown in FIG. 3, if a refractive index difference is higher than 0.02, the laser device oscillates in a high-order mode. If a refractive index difference is lower than 0.003, light is not effectively confined within the active layer. Thus, light is guided by gain-guide, resulting in an increase in the threshold current.

The width of the opening 180, and a refractive index difference among the p-type $Al_yGa_{1-y}N$ first cladding layer 116, the p-type $Al_yGa_{1-y}N$ second cladding layer 118 and the n-type $Al_uGa_{1-u}N$ current-defining layer 117, determine an intensity distribution of the light confined within the active layer. In view of this, it is preferred to set the width of the opening 180 at about 2 μm and to set a molar fraction u of Al in the n-type $Al_uGa_{1-u}N$ current-defining layer 117 at about 0.25. The molar fractions y and v are set at 0.15, which is the same as the molar fraction x of Al in the n-type $Al_xGa_{1-x}N$ cladding layer 114.

By using the p-type cladding layers ($Al_{0.15}Ga_{0.85}N$) 116 and 118 and the n-type current-defining layer ($Al_{0.25}Ga_{0.75}N$) 117, respectively having the controlled molar fractions, a laser light beam can be confined within the selected region of the active layer so as to have a refractive index distribution in a direction parallel to the active layer. As a result, a gallium nitride group compound semiconductor laser device operating in a single mode with a low threshold value, capable of oscillating a laser light beam free from aberration, can be realized.

In Example 1, the SiC inclined substrate which is inclined at about 3.5 degrees from the (0001) plane in the [11–20] direction, is utilized so that, in the case where, in particular, an AlGaN alloy crystal layer is deposited onto the SiC substrate, the surface of the AlGaN alloy crystal layer has a sufficient flatness. Specifically, as compared with the case where a (0001) just substrate is employed, the surface of the semiconductor crystal layer has a sufficient flatness when the inclined substrate is used. In particular, by using the substrate inclined at an angle in the range of about 3 to 12, the surface of the semiconductor crystal layer formed on the substrate has a remarkably superior flatness. In the specification of the present invention, a "(0001) just substrate" indicates a substrate which is not inclined in any direction from the (0001) plane.

Although the inclined substrate is employed in Example 1, it is apparent that the (0001) just substrate can be used instead.

Moreover, a ZnO layer can be used as the current-defining layer instead of the n-type $Al_uGa_{1-u}N$ layer. Since ZnO has a lattice constant close to that of GaN, it is possible to grow a ZnO layer on the gallium nitride group compound semiconductor layer. In addition, since ZnO is an insulating material and is capable of absorbing a blue laser beam emitted from the active layer, it is possible to effectively provide a refractive index difference for the active layer in a direction parallel to the surface of the substrate. Also in this case, it is preferred to determine a refractive index difference between the active layer 115a (first region) just below the opening 180 and the active layers 115b (second region) located below the current-defining layers within the range of about 0.003 and 0.02. Besides ZnO, any material capable of absorbing a laser beam, effectively generating a refractive index difference in the active layer in a direction parallel to the surface of the substrate, and defining a current so as to allow the current to flow solely through the opening 180, can be used as the current-defining layer.

Furthermore, by using the current-defining layer having a band gap smaller than that of the active layer so as to absorb a laser light beam emitted from the active layer, a refractive index difference can be generated in a direction parallel to the active layer. For example, in the case where $In_aGa_{1-a}N$ (0≦a≦1) is used for the active layer, it is possible to realize a layer capable of absorbing light emitted from the active layer by using $In_bGa_{1-b}N$ (0≦a<b≦1) having a band gap smaller than that of the active layer to form a current-defining layer. Moreover, by using the current-defining layer having a conductivity of n-type, the current is concentrated so as to flow through the opening 180, and is therefore prevented from being spread in the active layer.

Hereinafter, the reflectance of the resonator 160 of the semiconductor laser device according to the present invention will be described.

Figure 4:
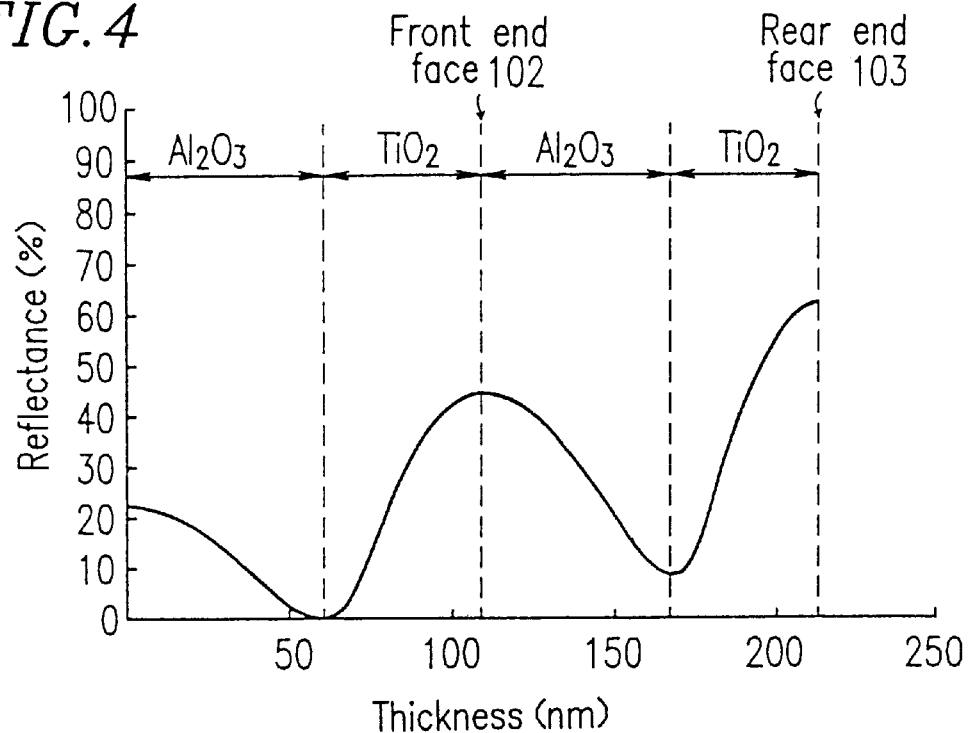
FIG. 4 is a graph showing a reflectance of $Al_2O_3/TiO_2$ dielectric films used as a resonator of the present invention.

FIG. 4 shows the relationship between the reflectance and the thickness of a dielectric film in the case where a resonator 160 is formed by using an $Al_2O_3$ film (refractive index: 1.65) and a $TiO_2$ film (refractive index: 2.2). A double-layered structure including an $Al_2O_3$ film and a $TiO_2$ film is formed on the front end face 102, while a quadruple-layered structure including an $Al_2O_3$ film, a $TiO_2$ film, an $Al_2O_3$ film and a $TiO_2$ film is formed on the rear end face 103. The thickness of each of the layers corresponds to about one-fourth of an oscillation wavelength (that is, λ/(4n), where λ is an oscillation wavelength and n is the refractive index of the dielectric film).

Figure 5:
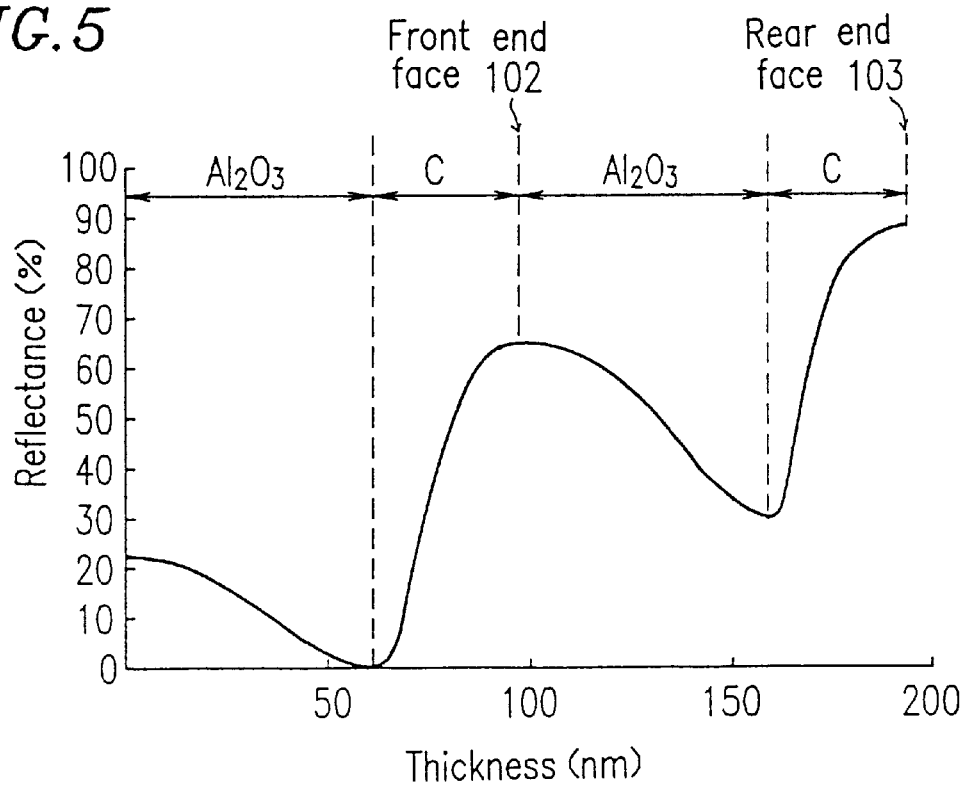
FIG. 5 is a graph showing a reflectance of $Al_2O_3/C$ dielectric films used as a resonator of the present invention.

As shown in FIG. 4, a reflectance of the front end face 102 is improved to about 44% owing to the double-layered structure including the $Al_2O_3$ film and the $TiO_2$ film. A reflectance of the rear end face 103 is improved to about 64% due to the quadruple-layered structure including the $Al_2O_3$ film the $TiO_2$ film, the $Al_2O_3$ film and the $TiO_2$ film FIG. 5 shows the relationship between the reflectance and the thickness of the dielectric film in the case where the resonator 160 is formed by using the $Al_2O_3$ film and the diamond (C) film (refractive index: 3.0). In this case, the reflectance of the front end face 102 is improved to about 65% due to the double-layered structure, including the $Al_2O_3$ film and the C film. A reflectance of the rear end face 103 is improved to about 88% owing to the quadruple-layered structure including the $Al_2O_3$ film, the C film, the $Al_2O_3$ film and the C film. From this fact, it is apparent that a reflectance can be further increased by using the $Al_2O_3$ film and the C film as compared with the case where the $Al_2O_3$ film and the $TiO_2$ film were used.

Figure 6:
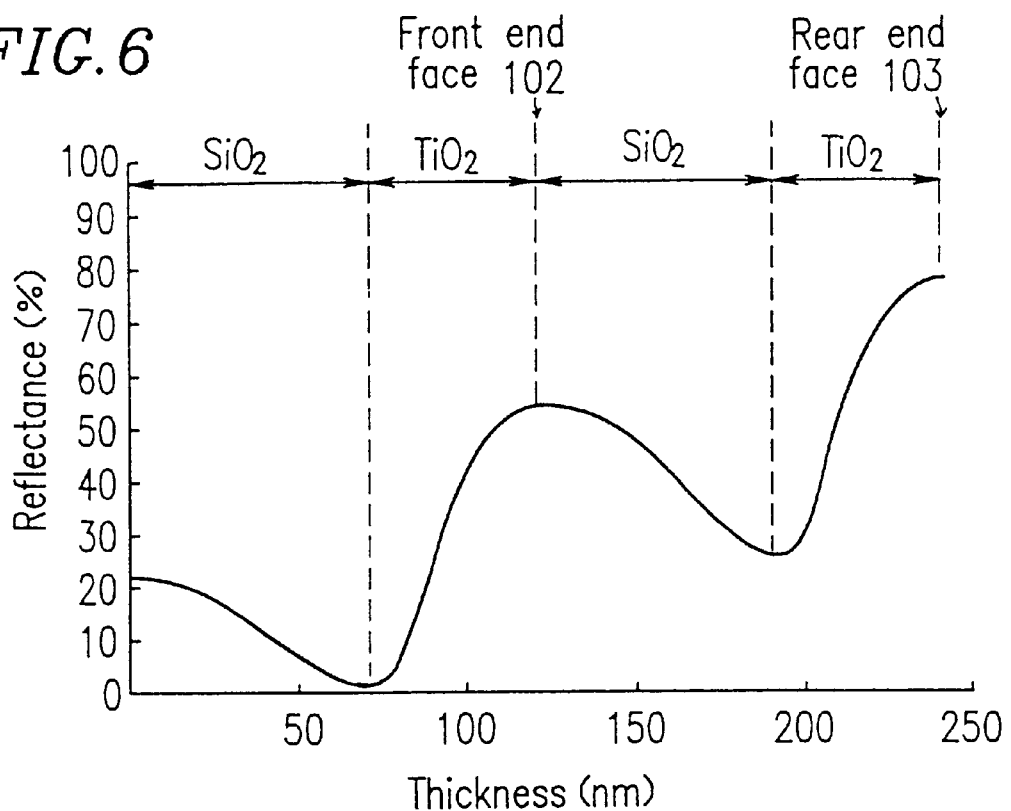
FIG. 6 is a graph showing a reflectance of $SiO_2/TiO_2$ dielectric films used as a resonator of the present invention.

FIG. 6 shows the relationship between a reflectance and a dielectric film in the case where the resonator 160 is formed by using an $SiO_2$ film (refractive index: 1.45) and a $TiO_2$ film. A reflectance at the front end face 102 is improved to about 54% due to the double-layered structure, including the $SiO_2$ film and the $TiO_2$ film. A reflectance at the rear end face 103 is improved to about 76% due to the quadruple-layered structure, including the $SiO_2$ film, the $TiO_2$ film, the $SiO_2$ film and the $TiO_2$ film.

Figure 7:
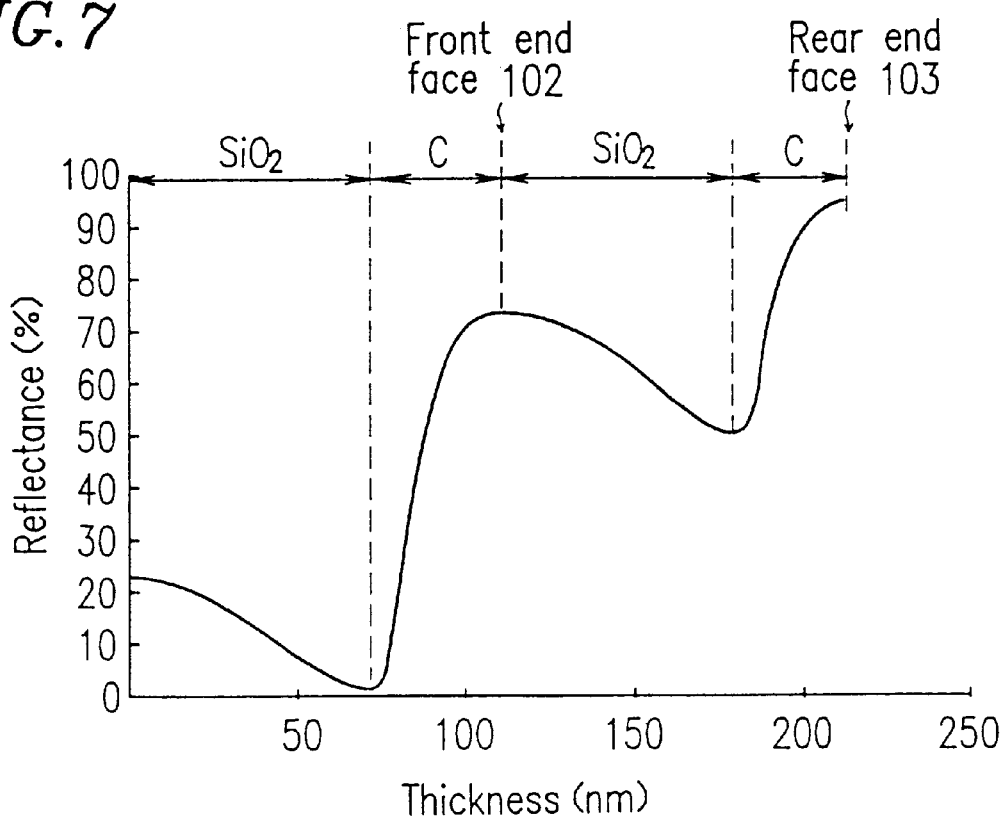
FIG. 7 is a graph showing a reflectance of $SiO_2/C$ dielectric films used as a resonator of the present invention.

FIG. 7 shows the relationship between a reflectance and a dielectric film in the case where the resonator 160 is formed by using an $SiO_2$ film and a C film. A reflectance at the front end face 102 is improved to about 72% due to the double-layered structure including the $SiO_2$ film and the C film. A reflectance at the rear end face 103 is improved to about 93% due to the quadruple-layered structure including the $SiO_2$ film, the C film, the $SiO_2$ film and the C film.

Since $Al_2O_3$ has a high thermal conductivity, the $Al_2O_3$ film is highly stable with respect to a laser light beam. Since diamond has a higher thermal conductivity, its heat radiation property can be further improved by providing a diamond film on the end face of the laser device, as compared with the case where the $Al_2O_3$ film is used.

Hereinafter, the characteristics of the semiconductor laser device of Example 1 will be described with reference to FIGS. 8A to 8C.

Figure 8A:
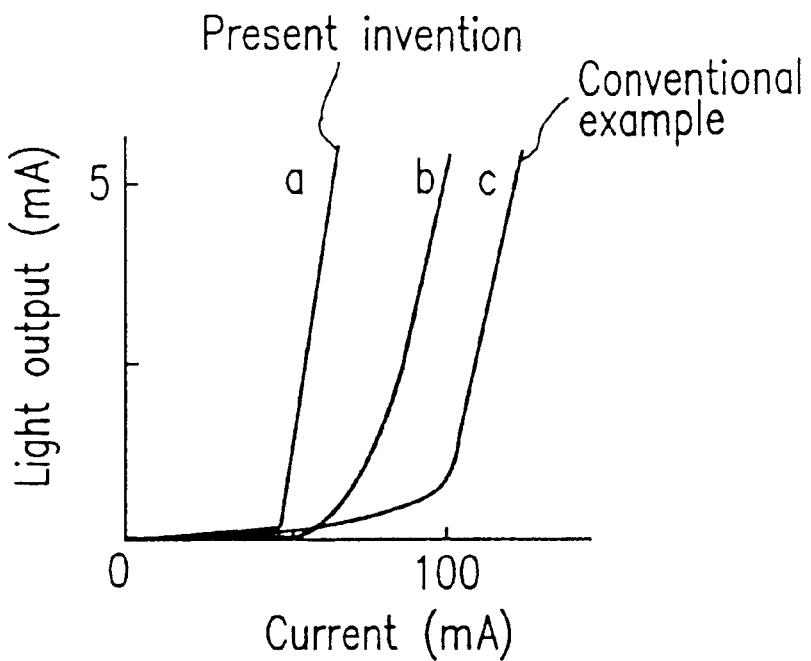
FIG. 8A is a graph showing current-light output characteristics.

FIG. 8A shows current-light output characteristics of semiconductor laser devices. In FIG. 8A, line a shows the current-light output characteristic of a semiconductor laser device having a current-defining layer and a resonator structure according to the present invention. Line b shows the current-light output characteristic of a semiconductor laser device having the resonator structure according to the present invention but not the current-defining layer. Line c shows the current-light output characteristic of a semiconductor laser device as a comparative example.

Figure 9:
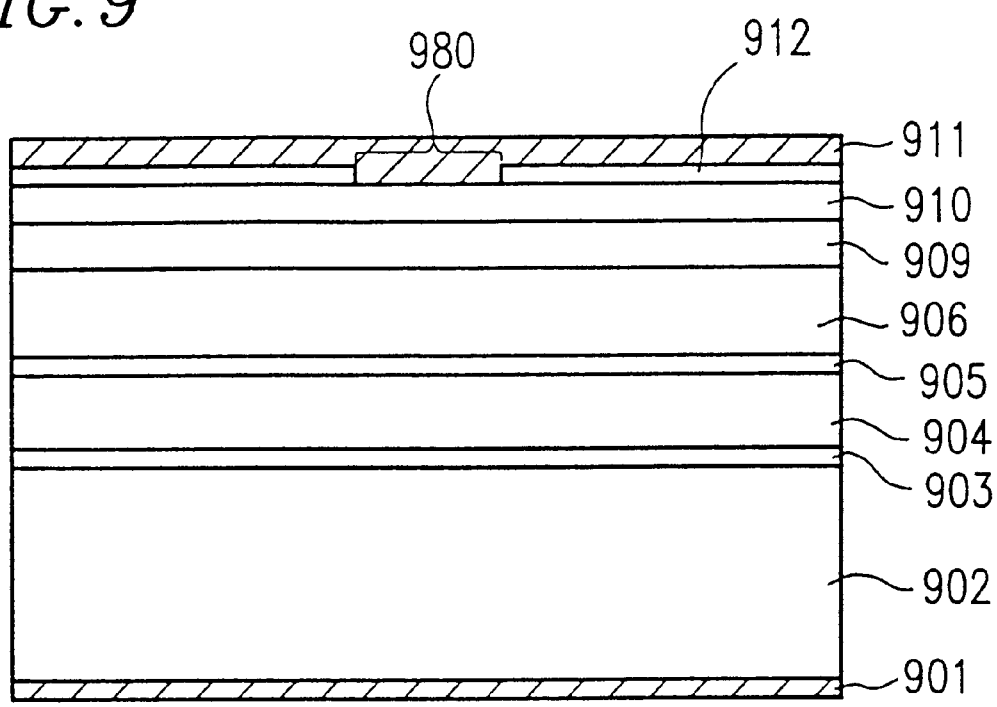
FIG. 9 is a cross-sectional view showing the configuration of a semiconductor laser device of a comparative example.

FIG. 9 schematically shows the configuration of a conventional gallium nitride group compound semiconductor laser device as a comparative example. As shown in FIG. 9, the semiconductor laser device illustrated as a comparative example includes an n-type SiC substrate 902, an n-type AlN buffer layer 903, an n-type AlGaN cladding layer 904, an InGaN active layer 905, a p-type AlGaN cladding layer 906, a p-type GaN cap layer 909, a p-type GaN contact layer 910, and a $SiO_2$ layer 912 having an opening 980 therethrough. A p-side electrode 911 is formed over the $SiO_2$ layer 912 and part of the p-type GaN contact layer 910 exposed through the opening 980. An n-side electrode 901 is formed on the bottom face of the substrate 902.

An oscillation wavelength can be changed from an ultraviolet region (370 nm, z=0) to a green region (510 nm, z=0.5) by changing the molar fraction z of In in the $In_zGa_{1-z}N$ active layer 905. This is a similar concept as in the case of the semiconductor laser device shown in FIG. 1B. By increasing a p-type impurity concentration in the p-type GaN cap layer 909 and the p-type GaN contact layer 910, an Ohmic contact with the p-side electrode 911 is formed. The $SiO_2$ layer 912 has the stripe-shaped opening 980, and serves to define the current to the opening 980.

As shown in FIG. 8A, based on the semiconductor laser device (line a) of Example 1, a threshold current, half or less than that of the semiconductor laser device of the comparative example (line c), can be obtained. Moreover, according to Example 1, a light output having a good linearity with respect to the current, can be obtained up to 5 mW or higher.

In the configuration of the GaN group semiconductor laser device can seen in the comparative example shown in FIG. 9, a current is defined within the stripe-shaped opening 980 by the $SiO_2$ layer 912. However, the current is laterally spread before reaching the active layer 905. As a result, an oscillation threshold current is increased. In addition, there is no difference in the refractive index serving to confine a laser light beam in a direction parallel to the active layer 905 because the laser light beam is concentrated just below the stripe-shaped opening 980 having a high gain. That is, light is guided by gain-guide. The light confined by the gain guide has a large aberration when the light is output from the end face of the laser device. This results in great difficulties when trying to focus the light onto the optical disk.

Pursuant to the semiconductor laser device of Example 1, a current can be concentrated in the region of the InGaN active layer 115 corresponding to the opening 180 of the current-defining layer 117. Therefore, an oscillation threshold current can be reduced. Moreover, since the InGaN active layer 115 has an effective refractive index difference in a direction parallel to the surface of the substrate 112, a laser beam can be confined within the selected region of the active layer. Therefore, the aberration of the laser light beam can be reduced.

Figure 8B:
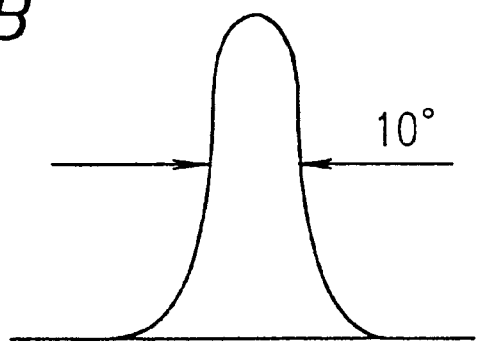
FIG. 8B is a view showing an intensity distribution of a laser light beam emitted from an end face of a semiconductor laser device according to the present invention.

FIG. 8B shows the intensity distribution of the laser light beam output from the end face of the semiconductor laser device of Example 1 in a direction parallel to the active layer. As can be seen from FIG. 8B, an intensity distribution having a single peak with a half-width of 10 degrees can be obtained. This signifies that the light is confined within the active layer, owing to the refractive index distribution in crystal, in a direction parallel to the active layer.

Figure 8C:
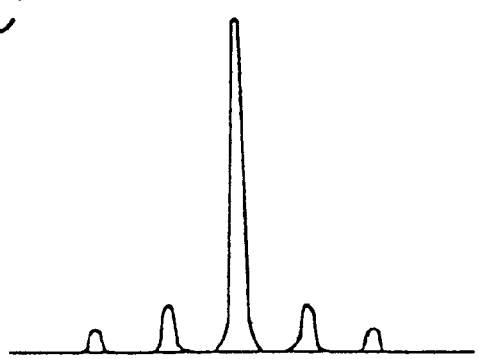
FIG. 8C is a view showing an oscillation wavelength spectrum of a semiconductor laser device according to the present invention.

FIG. 8C shows the oscillation wavelength spectrum of a semiconductor laser device of Example 1. As can be seen from FIG. 8C, single longitudinal mode oscillation having a peak wavelength of 412 nm and a longitudinal mode interval of about 0.03 nm is obtained in Example 1.

Hereinafter, a method for fabricating a semiconductor laser device of Example 1 will be described with reference to FIGS. 10A to 10C. In order to grow a semiconductor crystalline layer, metalorganic vapor phase epitaxy (MOVPE) is used.

Figure 10A:
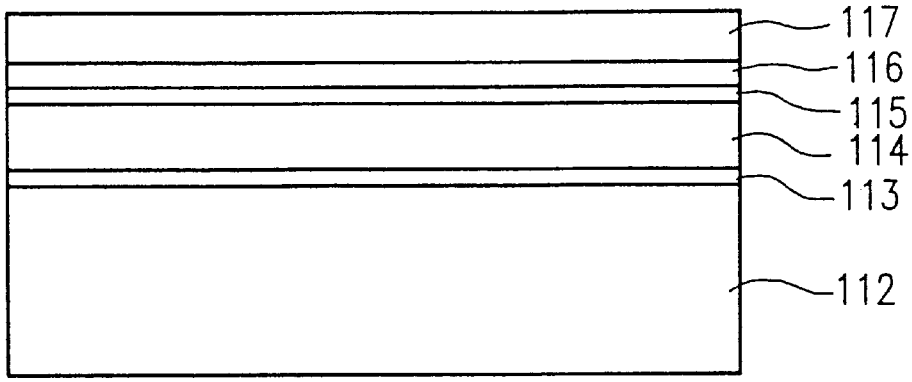
FIGS. 10A to 10C are cross-sectional views showing the steps of fabricating a semiconductor laser device of Example 1 according to the present invention.
Figure 10B:
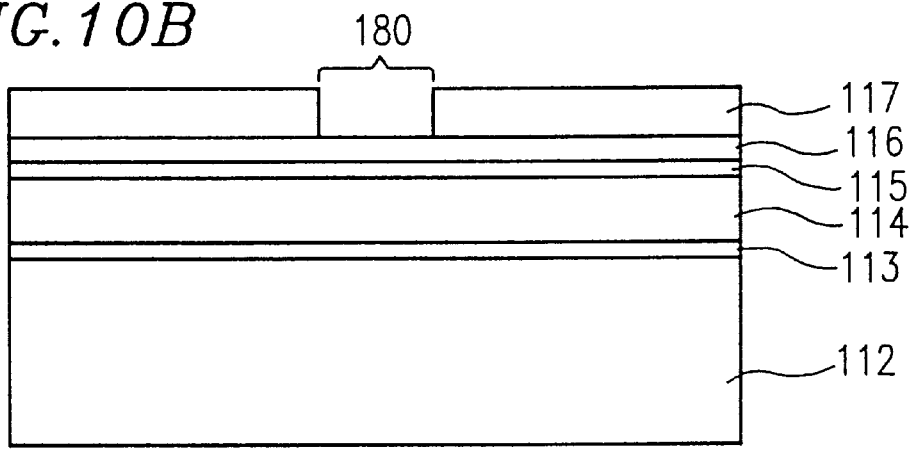

First, as shown in FIG. 10A, the n-type AlN buffer layer 113, the n-type AlGaN cladding layer 114, the InGaN active layer 115, the p-type AlGaN first cladding layer 116, and the n-type $Al_uGa_{1-u}N$ current-defining layer 117 are successively deposited on the n-type SiC substrate 112.

Next, a photomask having a stripe-shaped pattern is formed on the substrate 112. Then, as shown in FIG. 10B, the opening 180 is formed through the n-type $Al_uGa_{1-u}N$ current-defining layer 117 by etching. The etching is performed until part of the surface of the p-type AlGaN first cladding layer 116 is exposed through the opening 180.

Figure 10C:
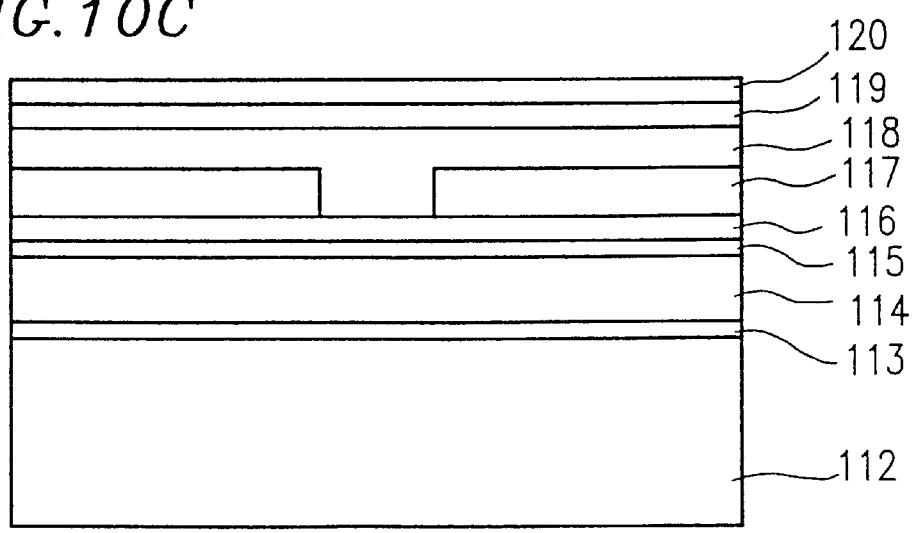

Subsequently, as shown in FIG. 10C, the p-type AlGaN second cladding layer 118, the p-type GaN cap layer 119 and the p-type contact layer 120 are grown on the substrate 112 by using the MOVPE method again.

Finally, although not shown, the p-side electrodes 121 and the n-side electrode 111 are respectively formed on the p-type contact layer 120 and the bottom face of the n-type SiC substrate 112, thereby completing the semiconductor laser device.

In order to form the dielectric films which include a resonator on the end faces of the laser device, sputtering and a CVD method are often employed. In order to form a highly pure dielectric film with a high reproducibility of the refractive index and a good controllability of the film thickness, the sputtering is superior to the CVD method. In sputtering, molecules of a target material such as $Al_2O_3$ are ejected by bombardment of a plasma of Ar against the target material. Therefore, end faces of the laser device are damaged by the Ar plasma. In the case where the sputtering is used to form the dielectric films on the end faces of an InGaAlP red-light semiconductor laser device, the lifetime of the laser device is shortened by the aforementioned damage. On the other hand, since the GaN group semiconductor crystal is hardly damaged during the fabrication of the GaN group semiconductor laser device, the $Al_2O_3$ film can be formed by sputtering. The $SiO_2$ film, the $TiO_2$ film and the diamond film are formed by sputtering.

EXAMPLE 2

Figure 11:
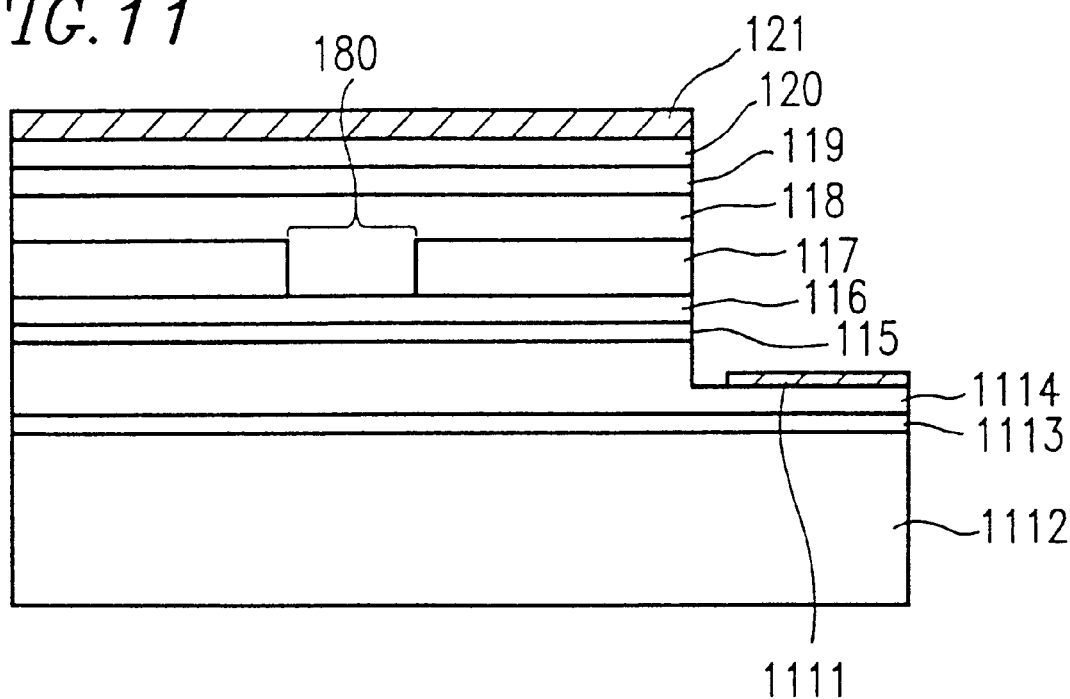
FIG. 11 is a cross-sectional view showing the configuration of a semiconductor laser device of Example 2.

With reference to FIG. 11, the semiconductor laser device of Example 2 according to the present invention will be described. Example 2 mainly differs from Example 1 described above in that $Al_2O_3$ is used for the substrate 1112. The same components as those in Example 1 are denoted by the same reference numerals. Hereinafter, only the parts which are different from Example 1 are described.

Since $Al_3O_2$ is used for the substrate 1112 and is an insulating material, part of an n-type AlGaN cladding layer 1114, which does not correspond to the opening 180, and part of the layers formed thereon are selectively removed by etching until part of the n-type AlGaN cladding layer 1114 is exposed in order to form an n-side electrode 1111. For this reason, the n-type AlGaN cladding layer 1114 of Example 2 has a large thickness, i.e., about 2 μm. The depth of the part of the n-type AlGaN cladding layer 1114 to be removed by etching is about 1 μm. The n-side electrode 1111 is formed on the exposed surface of the n-type AlGaN cladding layer 1114.

A buffer layer 1113 deposited on the substrate 1112 is made of GaN, and has a thickness of about 100 nm.

Also in Example 2, a refractive index difference is generated in a direction parallel to the InGaN active layer 115 by providing the n-type $Al_uGa_{1-u}N$ current-defining layer 117 having an opening 180. For the same reason as described in Example 1, the refractive index difference is preferably in the range of about 0.003 to 0.02.

Although the InGaN active layer, having a thickness of about 50 nm, is provided in the above description, the threshold current can be further lowered by using a single quantum well active layer in which an $In_aGa_{1-a}N$ ($0 \leq a \leq 1$) layer having a thickness of about 10 nm is interposed between a pair of $In_bGa_{1-b}N$ ($0 \leq b < a \leq 1$) layers, each having a thickness of about 50 nm. Moreover, the present invention is also applicable to a multi-quantum well active layer which includes two or more InaGalaN ($0 \leq a \leq 1$) layers. In the multi-quantum well active layer, an $In_bGa_{1-b}N$ ($0 \leq b < a \leq 1$) layer having a thickness of about 10 nm is interposed between the two $In_aGa_{1-a}N$ ($0 \leq a \leq 1$) layers. The same is applied to the following examples.

A light waveguide during laser oscillation can perform more effectively if a pair of $Al_xGa_{1-x}N$ ($0 \leq x \leq 1$) guide layers may be provided so as to interpose the active layer therebetween.

In order to form an Ohmic contact with a low resistance between the p-side electrode 121 and the p-type GaN contact layer 120 in the above description, a p-type impurity concentration in the p-type GaN contact layer 120 is set at $1 \times 10^{18}/cm^3$ or more. By using InGaN having an energy gap smaller than that of GaN, the resistance of the Ohmic contact can be further lowered. In such a case, setting a p-type impurity concentration at $1 \times 10^{18}/cm^3$ or more is preferable so as to realize a low contact resistance.

EXAMPLE 3

With reference to FIG. 12, a semiconductor laser device of Example 3 according to the present invention will be described.

FIG. 12 schematically shows the configuration of the semiconductor laser device of Example 3. As shown in FIG. 12, the semiconductor laser device includes a substrate 112, a semiconductor layered structure 1250 formed on the substrate 112, and the n-side electrode 111 and the p-side electrode 121 for supplying the current (driving current) which is necessary for emitting a laser light beam.

An n-type SiC substrate which is inclined at about 3.5 degrees from the (0001) plane in the [11–20] direction is used as the substrate 112.

The configuration of the semiconductor layered structure 1250 will be described below in detail.

The semiconductor layered structure 1250 includes (from the side close to the substrate 112): the n-type AlN buffer layer 113 (thickness: about 100 nm); an n-type $Al_xGa_{1-x}N$ cladding layer ($0 \leq x \leq 1$) 1214 (thickness: about 1 μm) having a ridge 1280; an $In_zGa_{1-z}N$ active layer ($0 \leq z \leq 1$) 1215 (thickness: about 50 nm) formed on the ridge 1280; a p-type $Al_yGa_{1-y}N$ first cladding layer ($0 \leq y \leq 1$) 1216 (thickness: about 200 nm) formed on the InGaN active layer 1215; and current-defining structures 1217 formed so as to laterally interpose the ridge 1280 therebetween. A p-type $Al_vGa_{1-v}N$ second cladding layer ($0 \leq v \leq 1$) 1218 (thickness: about 0.5 μm), the p-type GaN cap layer 119 (thickness: about 0.2 μm), and the p-type GaN contact layer 120 (thickness: about 0.1 μm; impurity concentration: about $1 \times 10^{18}/cm^3$ or higher) are formed on the current-defining structures 1217 and the p-type $Al_yGa_{1-y}N$ first cladding layer 1216. Si is used as an impurity of the n-type layers, and Mg is used as an impurity of the p-type layer. The p-type cladding layers according to the present invention include the p-type first cladding layer 1216 and the p-type second cladding layer 1218.

On the upper surface of the p-type GaN contact layer 120, the p-side electrode (Ni/Au) 121 is formed. On the bottom face of the substrate 112, the n-side electrode (Ti/Au) 111 is formed.

The energy gap of AlGaN increases and the refractive index decreases as a molar fraction x of Al in the n-type $Al_xGa_{1-x}N$ cladding layer ($0 \leq x \leq 1$) 1214 increases. The molar fraction x of Al in the n-type $Al_xGa_{1-x}N$ cladding layer 1214 depends on the molar fraction z of In in the $In_zGa_{1-z}N$ active layer 1215. The molar fraction z of In in the $In_zGa_{1-z}N$ active layer 1215 is adjusted in accordance with a desired oscillation wavelength. Accordingly, the molar fraction x of Al in the n-type $Al_xGa_{1-x}N$ cladding layer 1214 is determined in accordance with the desired oscillation wavelength. In the case where an oscillation wavelength is set to be within the 410 nm (violet) region, the molar fraction z is set to be about 0.15. Correspondingly, the molar fraction x is set to be within the range of about 0.1 to 0.2.

The ridge 1280 has a stripe-shaped portion extending along a length of the resonator. The ridge 1280 has a width m in the range of about 1 to 10 μm and a height h of about 0.75 μm.

Each of the current-defining structures 1217 includes a p-type $Al_uGa_{1-u}N$ burying layer ($0 \leq u \leq 1$) 1217a (thickness: about 0.25 μm) and an n-type $Al_vGa_{1-v}N$ burying layer ($0 \leq v \leq 1$) 1217b (thickness: about 0.5 μm). A current is defined within a region corresponding to the InGaN active layer 1215 (in this example, the stripe-shaped region extending along the length of the resonator) by the current-defining structures 1217.

The refractive index of AlGaN which forms the burying layers 1217a and 1217b is calculated such that it is smaller than that of the InGaN active layer 1215. In other words, a planar region including the InGaN active layer 1215 has a first region (i.e., the InGaN active layer 1215) and the remaining second region (i.e., the region including the burying layers 1217a and 1217b) in a direction parallel to the surface of the substrate 112. A refractive index of the first region is determined so as to be higher than that of the second region. As a result, a refractive index difference Δn (herein, it may also be referred to as an effective refractive index difference) is generated between the current-defining structures 1217 and the InGaN active layer 1215. Considering the width m of the ridge 1280, the refractive index difference Δn is adjusted. In the case where the ridge 1280 has a width m in the range of about 1 to 6 μm, it is preferred that the refractive index difference Δn between the current-defining structures 1217 and the InGaN active layer 1215 is within the range of about 0.003 to about 0.02 for the same reason as described in the above examples.

The width m of the ridge 1280 and the refractive index difference between the InGaN active layer 1215 and the burying layers 1217a and 1217b determine an intensity distribution of light confined within the InGaN active layer 1215. In view of this, the width m of the ridge 1280 is determined to be about 2 μm and the molar fractions u and v of Al in the p-type $Al_uGa_{1-u}N$ burying layer 1217a and the n-type $Al_vGa_{1-v}N$ burying layer 1217b to be about 0.05. The molar fraction y of Al in the p-type $Al_yGa_{1-y}N$ first cladding layer 1216 and the molar fraction v of the p-type $Al_vGa_{1-v}N$ second cladding layer 1218 are determined to be about 0.15 which is the same as the molar fraction x of Al in the n-type $Al_xGa_{1-x}N$ cladding layer 1214.

By adjusting the molar fraction as described above, a refractive index difference Δn of about 0.008 is generated between the active layer 1215 ($In_{0.15}Ga_{0.85}N$) and the burying layers 1217a and 1217b ($Al_{0.05}Ga_{0.95}N$). As a result, a laser light beam is confined within a selected region of the active layer 1215 owing to a refractive index distribution in a direction parallel to the active layer 1215. Thus, a gallium nitride group compound semiconductor laser device with a single mode and a low threshold current, capable of oscillating a laser beam free from aberration can be realized.

In Example 3, the SiC inclined substrate which is inclined at about 3.5 degrees from the (0001) plane in the [11–20] direction is utilized so that, in the case where, in particular, an AlGaN alloy crystal layer is deposited onto the SiC substrate, the surface of the AlGaN alloy crystal layer has a superior flatness. Specifically, as compared with the case where a (0001) just substrate is employed, the surface of the semiconductor crystal layer has a superior flatness in the case where the inclined substrate is used. In particular, by using the substrate inclined at an angle in the range of about 3 to 12, the surface of the semiconductor crystal layer formed on the substrate has a remarkably superior flatness.

Although the inclined substrate is employed in Example 3, it is apparent that the (0001) just substrate can be used instead.

Hereinafter, a method for fabricating the semiconductor laser device shown in FIG. 12 will be described with reference to FIGS. 13A to 13D. A MOVPE method is employed so as to grow the semiconductor crystalline layers.

First, as shown in FIG. 13A, the n-type AlN buffer layer 113, the n-type AlGaN cladding layer 1214, the InGaN active layer 1215, and the p-type AlGaN first cladding layer 1216 are successively grown on the n-type SiC substrate 112.

Next, the entire surface of the p-type AlGaN first cladding layer 1216 is covered with a $SiO_2$ film (not shown). Then, the $SiO_2$ film is patterned into a stripe shape, thereby forming a photomask 1330. Then, as shown in FIG. 13B, part of the n-type AlGaN cladding layer 1214 and the semiconductor layers formed thereon is selectively removed by etching until part of the n-type AlGaN cladding layer 1214 is exposed. In this manner, the ridge 1280 is formed. The thickness of the part of the n-type AlGaN cladding layer 1214 to be removed by etching is about half that of the n-type AlGaN cladding layer 1214 (about 1 μm), that is, about 0.5 μm. In this step, the p-type AlGaN first cladding layer 1216 formed thereon prevents the InGaN active layer 1215 from being damaged during the fabrication step.

Next, as shown in FIG. 13C, the p-type $Al_uGa_{1-u}N$ burying layers 1217a and the n-type AlGaN burying layers 1217b are grown on the substrate 112. In this case, the crystal growth is not performed on the $SiO_2$ film 1330. Thereafter, the $SiO_2$ film 1330 is removed.

Next, as shown in FIG. 13D, the p-type AlGaN second cladding layer 1218, the p-type GaN cap layer 119 and the p-type contact layer 120 are grown on the p-type AlGaN first cladding layers 1216 and the n-type AlGaN burying layers 1217b.

Finally, although not shown, the p-side electrode 121 is formed on the p-type contact layer 120, and the n-side electrode 111 is formed on the bottom face of the n-type SiC substrate 112, thereby completing the semiconductor laser device.

EXAMPLE 4

Figure 14:
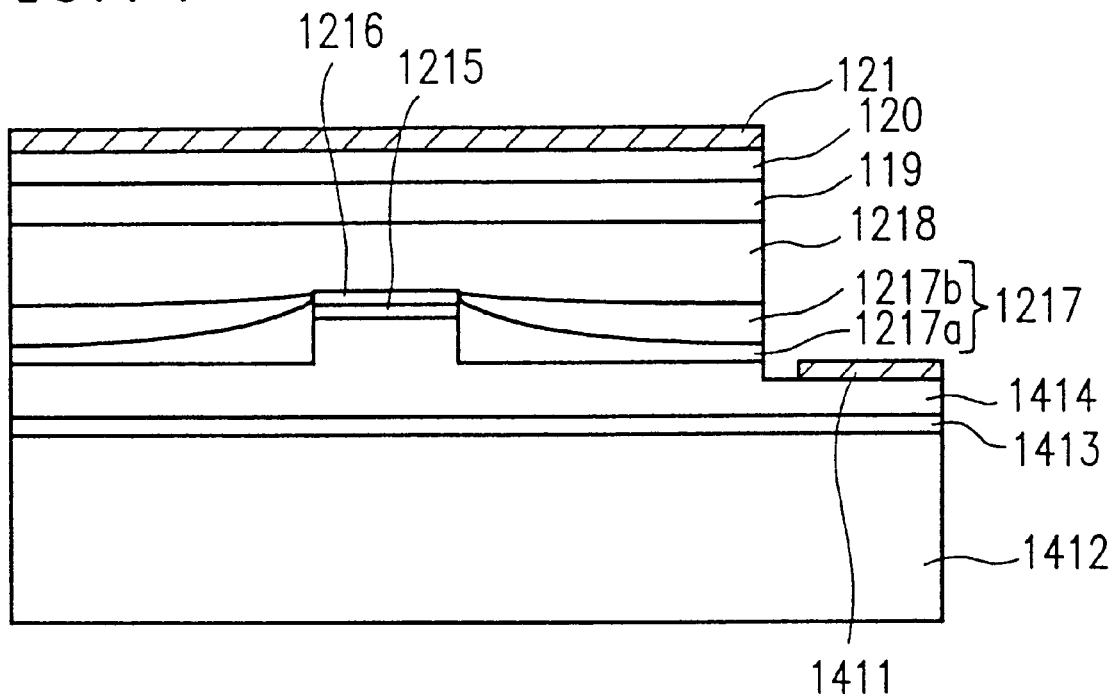
FIG. 14 is a cross-sectional view showing the configuration of a semiconductor laser device of Example 4.

A semiconductor laser device of Example 4 according to the present invention will be described with reference to FIG. 14. Example 4 mainly differs from Example 3 described above in that the substrate 1412 is made of $Al_2O_3$. Only the parts that differ from those in Example 3 are described below.

Since the $Al_2O_3$ used for the substrate 1412 is an insulating material, part of the n-type AlGaN cladding layer 1414 which does not correspond to the ridge 1280 and the layers formed thereon is selectively removed by etching until part of the n-type AlGaN cladding layer 1414 is exposed in order to form the n-side electrode 1411. For this reason, the n-type AlGaN cladding layer 1414 of Example 4 has a large thickness, i.e., about 2 μm. The depth of this part has a value, i.e., about 1 μm. The n-side electrode 1411 is formed on the exposed part of the n-type AlGaN cladding layer 1414.

The buffer layer 1413 formed on the substrate 1412 is made of GaN, and has a thickness of about 100 nm.

Also in Example 4, a refractive index difference in the range of about 0.003 to about 0.02 is generated between the InGaN active layer 1215 and the AlGaN burying layers 1217a and 1217b for the same reason as described in Example 3.

EXAMPLE 5

The semiconductor laser device of Example 5 according to the present invention will be described with reference to FIG. 15.

Figure 15:
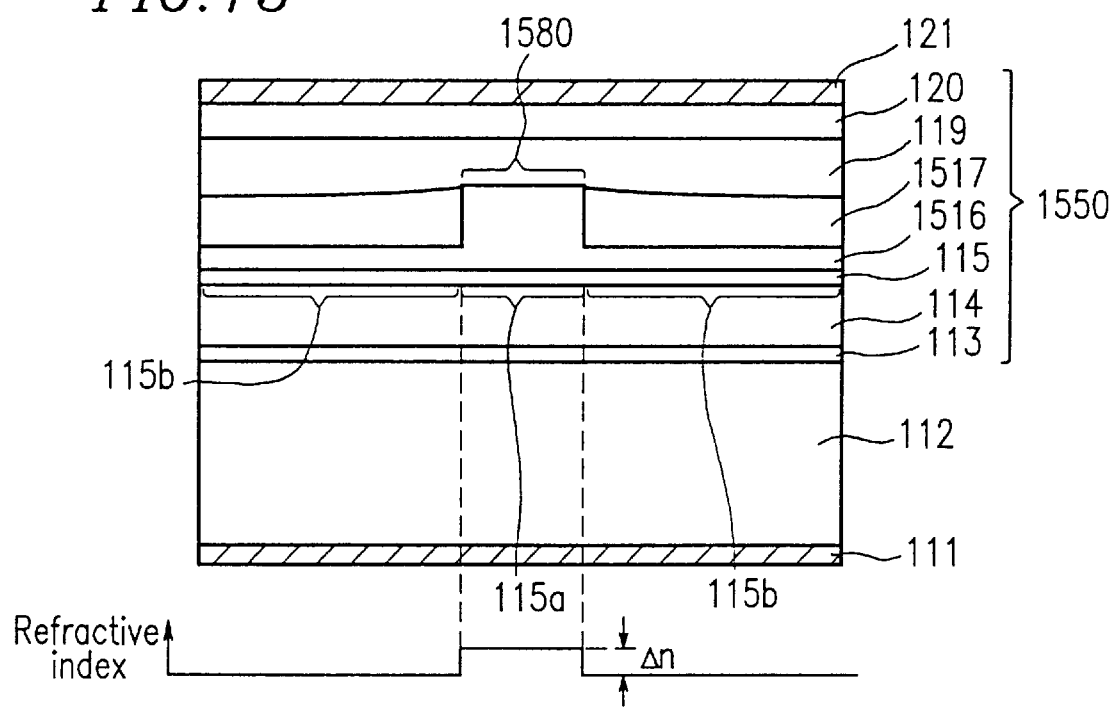
FIG. 15 is a cross-sectional view showing the configuration of a semiconductor laser device of Example 5.

FIG. 15 schematically shows the configuration of the semiconductor laser device of Example 5. As shown in FIG. 15, the semiconductor laser device includes the substrate 112, a semiconductor layered structure 1550 formed on the substrate 112, and a pair of electrodes 111 and 121 for supplying the current (a driving current) which is required for emitting light.

As for the substrate 112, an n-type SiC substrate inclined at about 3.5 degrees from a (0001) plane in a [11–20] direction is utilized.

The configuration of the semiconductor layered structure 1550 will be described below.

The semiconductor layered structure 1550 includes (from the side close to the substrate 112): the n-type AlN buffer layer 113 (thickness: about 100 nm); the n-type $Al_xGa_{1-x}N$ cladding layer ($0 \leq x \leq 1$) 114 (thickness: about 1 μm); the $In_zGa_{1-z}N$ active layer ($0 \leq z \leq 1$) 115 (thickness: about 50 nm); a p-type $Al_yGa_{1-y}N$ cladding layer ($0 \leq y \leq 1$) 1516 (thickness: about 1 μm); n-type $Al_uGa_{1-u}N$ burying layers (current-defining layers, $0 \leq u \leq 1$) 1517 (thickness: about 1 μm); the p-type GaN cap layer 119 (thickness: about 0.5 μm); and the p-type GaN contact layer 120 (thickness: about 0.5 μm; impurity concentration: about $1 \times 10^{18}/cm^3$ or more). Si is used as an impurity of the n-type layers, and Mg is used as an impurity of the p-type layers.

An energy gap of AlGaN increases and a refractive index thereof decreases as a molar fraction x of Al in the n-type $Al_xGa_{1-x}N$ cladding layer ($0 \leq x \leq 1$) 114 increases. The molar fraction x of Al in the n-type $Al_xGa_{1-x}N$ cladding layer 114 depends on a molar fraction z of In in the $In_zGa_{1-z}N$ active layer 115. The molar fraction z of In in the $In_zGa_{1-z}N$ active layer 115 is adjusted in accordance with a desired oscillation wavelength. Accordingly, the molar fraction x of Al in the n-type AlGaN cladding layer 114 is determined in accordance with the desired oscillation wavelength. In the case where an oscillation wavelength is set to be within a 410 nm (violet) region, the molar fraction z is obtained to be about 0.15. Correspondingly, the molar fraction x is set to be within the range of about 0.1 to 0.2.

The p-type AlGaN cladding layer 1516 has a stripe-shaped ridge 1580 extending along a length of the resonator. The bottom face of the ridge 1580 does not reach the InGaN active layer 115. The n-type AlGaN burying layers 1517 are formed so as to laterally interpose the ridge 1580 therebetween. The width of the ridge 1580 is determined so as to adjust the lateral mode of the laser oscillation. In Example 5, the ridge 1580 has a width in the range of about 1 to 10 μm and a height of about 0.75 μm.

The p-side electrode (Ni/Au) 121 is formed on the p-type GaN contact layer 120, and the n-side electrode (Ti/Au) 111 is formed on the bottom face of the substrate 112.

A voltage is supplied from a current supplying circuit (not shown) to the electrodes 111 and 121. As a result, a current flows through the semiconductor layered structure 1550 from the p-side electrode 121 and the n-side electrode 111. At this time, since the current is blocked by the n-type AlGaN burying layer 1517, the current is defined to flow downward through the ridge 1580 of the p-type AlGaN cladding layer 1516. As a result, the current flows through only the region of the InGaN active layer 115 corresponding to the ridge 1580 (i.e., a region located directly below the ridge 1580). The above configuration allows the current to be defined within the selected region of the InGaN active layer 115. As a result, controlled laser oscillation in a lateral mode occurs. Thus, the semiconductor laser device having a low threshold current density can be obtained.

By determining a molar fraction u of Al in the n-type $Al_uGa_{1-u}N$ burying layer 1517 to be larger than a molar fraction y of Al in the p-type $Al_yGa_{1-y}N$ cladding layer 1516, a refractive index of the n-type AlGaN burying layer 1517 is calculated to be smaller than that of the p-type AlGaN cladding layer 1516. A refractive index difference is generated in a direction parallel to the InGaN active layer 115 by controlling the molar fraction of Al. Therefore, a refractive index difference (an effective refractive index difference of the active layer) Δn is generated between the active layer 115a located directly below the ridge 1580 and the active layer 115b located below the n-type AlGaN burying layer 1517. The effective refractive index difference Δn allows light to be confined in the direction parallel to the active layer 115, thereby achieving the index-guide. As a result, a laser beam free from aberration can be obtained.

The effective refractive index difference Δn of the InGaN active layer 115 is also affected by the width of the ridge 1580. In the case where the ridge 1580 has a width in the range of about 1 to 6 μm, the effective refractive index difference Δn between the active layer 115a immediately below the ridge 1580 and the active layer 115b located below the n-type AlGaN burying layer 1517 is in the range of about 0.003 to 0.02. If the refractive index difference exceeds 0.02, the laser device oscillates in a higher-order mode. On the other hand, if the refractive index difference is lower than 0.003, light is leaked from the layer adjacent to the InGaN active layer 115. Therefore, light is not effectively confined within the InGaN active layer 115. As a result, light is guided by gain-guide, thereby increasing a threshold current.

The width of the ridge 1580 and the refractive index difference between the p-type AlGaN cladding layer 1516 and the n-type AlGaN burying layer 1517 determine an intensity distribution of light confined within the InGaN active layer 115. In view of this, it is preferred to determine the width of the ridge 1580 to be about 2 μm and to determine the molar fraction u of Al in the n-type $Al_uGa_{1-u}N$ burying layer 1517 to be about 0.25. The molar fraction y of the p-type $Al_yGa_{1-y}N$ cladding layer 1516 is determined to be 0.15, which is the same as the molar fraction x of Al in the n-type AlGaN cladding layer 114. By adjusting the molar fraction in this manner, a refractive index difference of 0.008 is generated between the p-type cladding layer ($Al_{0.15}Ga_{0.85}N$) 1516 and the n-type AlGaN burying layer ($Al_{0.25}Ga_{0.75}N$) 1517. The laser light beam is confined within the selected region of the active layer owing to a refractive index distribution. Therefore, a gallium nitride group compound semiconductor laser device with a single mode and a low threshold current, capable of oscillating a laser light beam free from aberration, can be realized.

In Example 5, the SiC inclined substrate which is inclined at about 3.5 degrees from the (0001) plane in the [11–20] direction is utilized so that, in the case where, in particular, an AlGaN alloy crystal layer is deposited onto the SiC substrate, the surface of the AlGaN alloy crystal layer has a superior flatness. Specifically, as compared with the case where a (0001) just substrate is employed, the surface of the semiconductor crystal layer has a better flatness in the case where the inclined substrate is used. In particular, by using a substrate which is inclined at an angle in the range of about 3 to about 12, the surface of the semiconductor crystal layer formed on the substrate has a remarkably superior flatness. Although the inclined substrate is employed in Example 5, it is apparent that the (0001) just substrate can alternatively be used.

A ZnO layer can be used instead of an n-type AlGaN layer as the current-defining layer (burying layer 1517). Since ZnO has a lattice constant close to that of GaN, the crystal growth of ZnO can be performed on the gallium nitride group compound semiconductor layer. Moreover, since ZnO is an insulating material and capable of absorbing a blue laser light beam generated in the active layer, it is possible to effectively generate a refractive index difference in a direction parallel to the active layer. Also in this case, it is preferred to set a refractive index difference between the active layer 115a directly below the ridge 1580 and the active layer 115b below the current-defining layer to be within the range of about 0.003 to 0.02. Any material can be used as the current-defining layer instead of ZnO as long as it can absorb a laser light beam, effectively generate a refractive index difference in a direction parallel to the active layer, and define the current so as to allow the current to flow through the ridge 1580.

Furthermore, by using a layer which has a band gap smaller than that of the active layer as the current-defining layer so as to absorb the laser light emitted from the active layer, a refractive index difference is effectively generated in a direction parallel to the active layer. As a result, a refractive index can be effectively generated in a direction parallel to the active layer. For example, in the case where an $In_aGa_{1-a}N$ ($0 \leq a \leq 1$) layer is utilized as the active layer, a layer capable of absorbing light emitted from the active layer can be realized by using an $In_bGa_{1-b}N$ ($0 \leq a<b \leq 1$) layer having a band gap smaller than that of the $In_aGa_{1-a}N$ layer as the current-defining layer. Moreover, by providing the current-defining layer with an n-type conductivity, a current is concentrated on the ridge 1580 so that a current is prevented from spreading in the active layer.

Hereinafter, with reference to FIGS. 16A to 16D, a method for fabricating a semiconductor laser device of FIG. 15 will be described. In order to grow a semiconductor crystalline layer, a MOVPE method is employed.

Figure 16A:
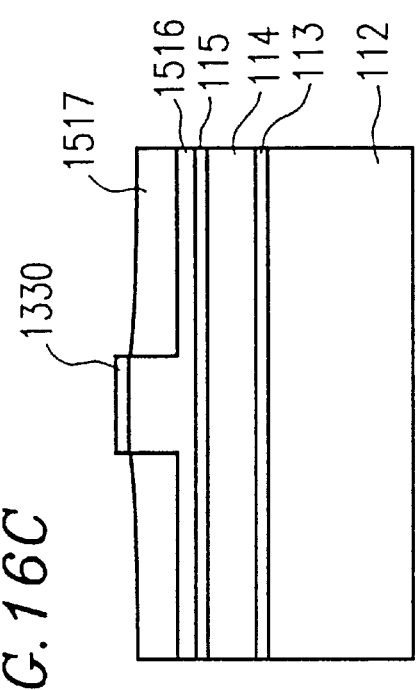
FIGS. 16A to 16D are cross-sectional views showing the steps of fabricating the semiconductor laser device of Example 5 according to the present invention.

First, as shown in FIG. 16A, the n-type AlN buffer layer 113, the n-type AlGaN cladding layer 114, the InGaN active layer 115 and a p-type AlGaN cladding layer 1516 (thickness: about 1.75 μm) are grown on the n-type SiC substrate 112.

Figure 16B:
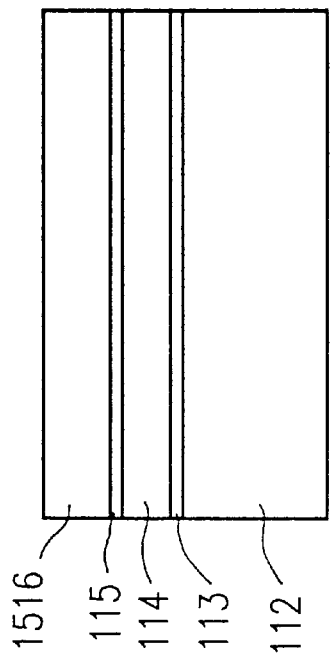

Next, the entire surface of the substrate 112 is covered with a SiO$_2$ film. Thereafter, the SiO$_2$ film is patterned into a stripe shape, thereby forming a photomask 1330. Next, as shown in FIG. 16B, part of the p-type AlGaN cladding layer 1516, which has a thickness of about 0.75 μm, is selectively removed by etching. In this manner, a ridge 1580 having a height of about 0.75 μm is formed.

Figure 16C:
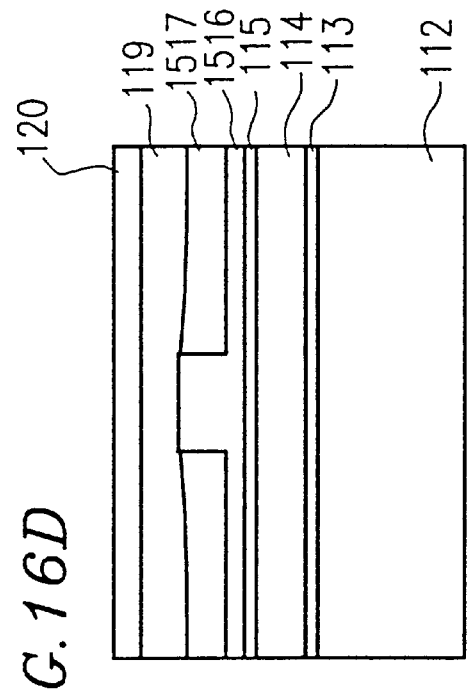

Next, as shown in FIG. 16C, n-type AlGaN burying layers 1517 are grown on the p-type AlGaN cladding layer 1516 by employing a MOVPE method. In this case, the crystal growth is not performed on the SiO$_2$ film 1330. Thereafter, the SiO$_2$ film 1330 is removed.

Figure 16D:
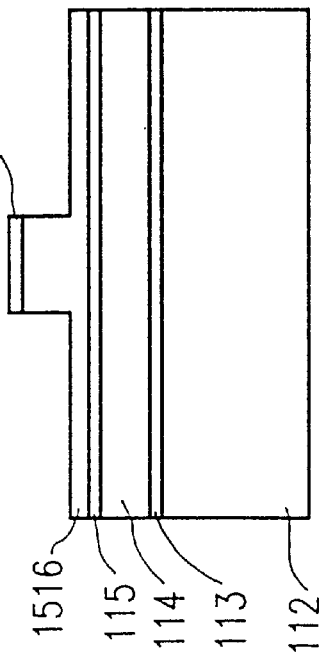

Subsequently, as shown in FIG. 16D, the p-type GaN cap layer 119 and the p-type contact layer 120 are grown on the n-type burying layers 1517 and the ridge 1580.

Finally, although not shown, the p-side electrode 121 is formed on the p-type contact layer 120, and the n-side electrode 111 is formed on the bottom face of the n-type SiC substrate 112, thereby completing the semiconductor laser device.

EXAMPLE 6

Figure 17:
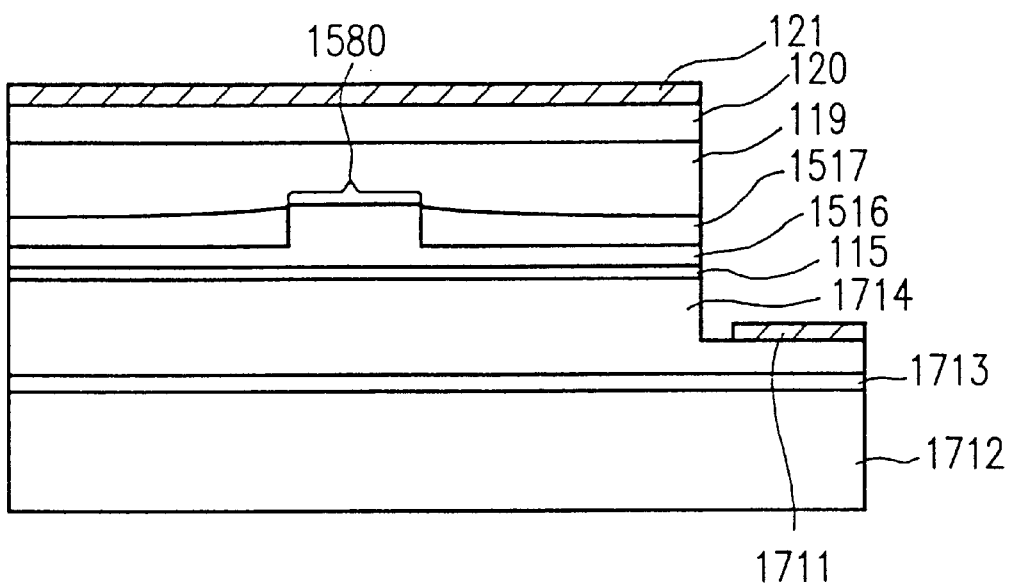
FIG. 17 is a cross-sectional view showing the configuration of a semiconductor laser device of Example 6.
Figure 18:
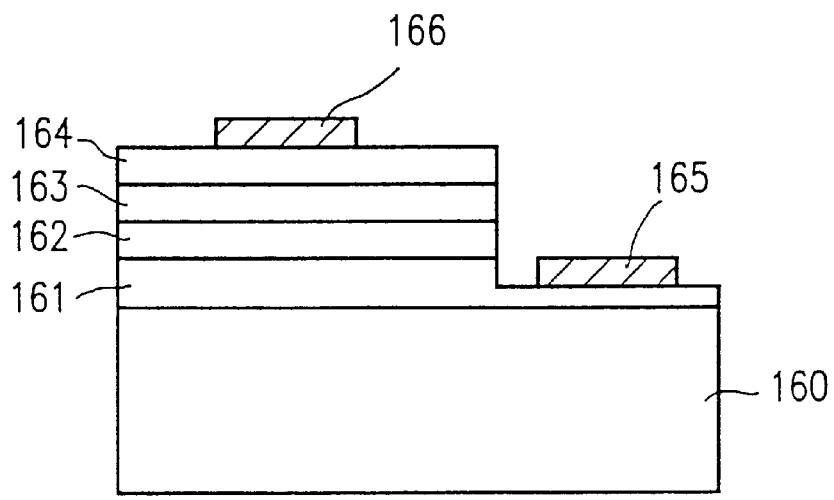
FIG. 18 is a cross-sectional view showing the configuration of a conventional semiconductor light-emitting element.

A semiconductor laser device of Example 6 according to the present invention will be described with reference to FIG. 17. Example 6 mainly differs from Example 5 in that an Al$_2$O$_3$ substrate is utilized as a substrate 1712. Hereinafter, only the parts which differ from those in Example 5 will be described.

Since Al$_3$O$_2$ used for the substrate 1712 is an insulating material, part of the n-type AlGaN cladding layer 1714 which does not correspond to the ridge 1580 and part of the layers formed thereon are selectively removed by etching until part of the n-type AlGaN cladding layer 1714 is exposed for forming the n-side electrode 1711. Thus, the n-type AlGaN cladding layer 1714 of Example 6 has a large thickness, i.e., about 2 μm. Part of the n-type AlGaN cladding layer 1714 to be removed by etching has a thickness of about 1 μm. On the exposed part of the n-type AlGaN cladding layer 1714, an n-type electrode 1711 is formed.

A buffer layer 1713 formed on the substrate 1712 is made of GaN, and has a thickness of about 100 nm.

As in Example 5, a refractive index difference is generated in a direction parallel to the InGaN active layer 115 by providing the ridge 1580 of the p-type AlGaN cladding layer 1516 and the n-type AlGaN burying layers 1517. It is preferred that the refractive index difference is within the range of about 0.003 to 0.02 for the same reason as described in the above examples.

Although Ni/Au is used for the p-side electrode 121 in the above examples, the present invention is not limited thereto. In order to reduce the contact resistance between the p-type electrode 121 and the p-type GaN contact layer 120, it is preferable to use a material having a large work function such as Pt or Pd for the p-side electrode 121.

If a Pt film having a thickness of about 1000 Å is formed as the p-side electrode 121 on the p-type GaN contact layer 120, for example, an operation voltage of the laser device is reduced to about 5 V, which is about one-third the operation voltage of a conventional laser device. The reason for this is as follows. A potential barrier of a valence band between Pt and the p-type GaN contact layer 120 is about 0.29 eV. On the other hand, a potential barrier of a valence band between Ni serving as a material of the p-side electrode in the conventional laser device and the p-type GaN contact layer is about 0.79 eV. Specifically, according to the present invention, the potential barrier of the valence band between the p-side electrode and the p-side GaN contact layer 120 is reduced by about 0.50 eV as compared with the conventional potential barrier.

Ni/Pt may be used as a material of the p-side electrode 121 instead of Pt. More specifically, after depositing a Ni film having a thickness of about 1000 Å on the p-type GaN contact layer 120, a Pt film having a thickness of about 1000 Å is formed on the Ni film. Thereafter, the substrate is thermally treated at about 450° C. for ten minutes.

By this thermal treatment, Pt in the Pt film formed on the Ni film is diffused toward the p-type GaN contact layer 120 so as to be in contact with the p-type GaN contact layer 120. A potential barrier of the valence band between Pt and the p-type GaN contact layer 120 is about 0.29 eV. On the other hand, a potential barrier of the valence band between Ni serving as a material of the p-side electrode in the conventional laser device and the p-type GaN contact layer is about 0.79 eV. Specifically, according to the present invention, the potential barrier of the valence band between the p-side electrode and the p-type GaN contact layer 120 is reduced by about 0.50 eV as compared with a potential barrier in a conventional method. According to the present invention, a contact resistance between the p-side electrode and the p-type GaN contact layer 120 is reduced. As a result, the operation voltage of the laser device according to the present invention is about 5 V, which is about one-third the operation voltage of a conventional laser device.

By providing the Ni film below the Pt film, an adherence between the p-side electrode (Pt) and the p-type GaN contact layer 120 can be improved. Therefore, the problem occurring in the conventional method, whereby the p-side electrode is pealed off in the step of processing the substrate by dry etching to have a cavity length (about 1 mm), can be prevented from occurring.

According to a semiconductor laser device of the present invention, the following effect can be obtained.

By providing a current-defining means in a direction parallel to the junction plane of the semiconductor layers, a current is defined within the selected region (a stripe-shaped region) of the active layer. Therefore, the threshold current density can be lowered.

By providing a refractive index difference in a direction parallel to the active layer, a laser light beam can be confined within the selected region (the stripe-shaped region) of the active layer. Therefore, a laser beam free from aberration is obtained. Accordingly, the semiconductor laser device according to the present invention can be utilized as a light source for an optical disk on which data is recorded at a high density.

Furthermore, dielectric multi-layered films are formed as resonators on the end faces of the laser device, so that the threshold current density can be further lowered.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gallium nitride group compound semiconductor laser device comprising:

a substrate; and a layered structure provided on the substrate, the layered structure including an active layer, an n-type $Al_xGa_{1-x}N$ cladding layer ($0 \leq x \leq 1$) and a first p-type $Al_yGa_{1-y}N$ cladding layer ($0 \leq y \leq 1$) interposing the active layer therebetween, and a current-defining structure made of $Al_uGa_{1-u}N$ ($0 < u \leq 1$) having an opening which is formed over the first p-type $Al_yGa_{1-y}N$ cladding layer, and a second p-type $Al_vGa_{1-v}N$ cladding layer $0 \leq V < 1$) which is formed in the opening of the current defining structure, wherein u is greater than v.

2. A gallium nitride group compound semiconductor laser device according to claim 1, wherein the current-defining structure has an n-type conductivity, and is formed in the p-type $Al_yGa_{1-y}N$ cladding layer.

3. A gallium nitride group compound semiconductor laser device according to claim 2, wherein the current-defining structure is made of ZnO.

4. A gallium nitride group compound semiconductor laser device according to claim 1, wherein the current-defining layer includes an n-type $Al_{u1}Ga_{1-u1}N$ layer ($0 \leq u1 \leq 1$) and a p-type $Al_{u2}Ga_{1-u2}N$ layer ($0 \leq u2 \leq 1$), and is formed between the n-type $Al_xGa_{1-x}N$ cladding layer and the p-type $Al_yGa_{1-y}N$ cladding layer, and wherein the n-type $Al_xGa_{1-x}N$ cladding layer has a ridge located within the opening of the current-defining structure, and the active layer is formed on the ridge.

5. A gallium nitride group compound semiconductor laser device according to claim 1, wherein the current-defining structure has an n-type conductivity, and is formed on the p-type $Al_yGa_{1-y}N$ cladding layer, wherein the p-type $Al_yGa_{1-y}N$ cladding layer has a ridge located within the opening of the current-defining structure, and the molar fraction y is smaller than the molar fraction u.

6. A gallium nitride group compound semiconductor laser device according to claim 5, wherein the current-defining structure is made of ZnO.

7. A gallium nitride group compound semiconductor laser device according to claim 1, wherein the substrate is made of n-type SiC, and an n-type AlN buffer layer is formed on a surface of the substrate.

8. A gallium nitride group compound semiconductor laser device according to claim 7, wherein the surface of the substrate is inclined at a first angle from a (0001) plane in a [11–20] direction.

9. A gallium nitride group compound semiconductor laser device according to claim 8, wherein the first angle falls within the range of about 3 degrees to about 12 degrees.

10. A gallium nitride group compound semiconductor laser device according to claim 1, wherein the substrate is made of $Al_2O_3$, and a GaN buffer layer is formed on a surface of the substrate.

11. A gallium nitride group compound semiconductor laser device according to claim 1, wherein a p-type contact layer is formed on the p-type $Al_yGa_{1-y}N$ cladding layer.

12. A gallium nitride group compound semiconductor laser device according to claim 11, wherein the p-type contact layer includes a p-type GaN cap layer and a p-type GaN contact layer containing an impurity at $1 \times 10^{18}/cm^3$ or more.

13. A gallium nitride group compound semiconductor laser device according to claim 11, wherein a p-side electrode made of either Pt or Pd is provided on the p-type contact layer.

14. A gallium nitride group compound semiconductor laser device according to claim 13, wherein a Ni film is formed between the p-type contact layer and the p-side electrode.

15. A gallium nitride group compound semiconductor laser device according to claim 1, wherein the active layer includes at least two $In_aGa_{1-a}N$ quantum well layers ($0 \leq a \leq 1$) and an $In_bGa_{1-b}N$ barrier layer ($0 \leq b < a \leq 1$) formed between the two quantum well layers.

16. A gallium nitride group compound semiconductor laser device according to claim 1, wherein at least one double-layered structure including an $Al_2O_3$ film having a thickness corresponding to one-fourth an oscillation wavelength and a $TiO_2$ film having a thickness corresponding to one-fourth the oscillation wavelength is formed on at least one end face of the layered structure.

17. A gallium nitride group compound semiconductor laser device according to claim 16, wherein the $Al_2O_3$ film and the $TiO_2$ film are formed by sputtering.

18. A gallium nitride group compound semiconductor laser device according to claim 1, wherein at least one double-layered structure including an $Al_2O_3$ film having a thickness corresponding to one-fourth an oscillation wavelength and a diamond film having a thickness corresponding to one-fourth the oscillation wavelength is formed on at least one end face of the layered structure.

19. A gallium nitride group compound semiconductor laser device according to claim 1, wherein at least one double-layered structure including a $SiO_2$ film having a thickness corresponding to one-fourth an oscillation wavelength and a $TiO_2$ film having a thickness corresponding to one-fourth the oscillation wavelength is formed on at least one end face of the layered structure.

20. A gallium nitride group compound semiconductor laser device according to claim 1, wherein at least one double-layered structure including a $SiO_2$ film having a thickness corresponding to one-fourth an oscillation wavelength and a diamond film having a thickness corresponding to one-fourth the oscillation wavelength is formed on at least one end face of the layered structure.

21. A gallium nitride group compound semiconductor laser device according to claim 20, wherein the $SiO_2$ film and the diamond film are formed by sputtering.

22. A gallium nitride group compound semiconductor laser device according to claim 1, wherein y is smaller than u.

23. A gallium nitride group compound semiconductor laser device according to claim 22, wherein the second p-type $Al_yGa_{1-y}N$ cladding layer is a ridge of the first p-type $Al_yGa_{1-y}N$ cladding layer.

* * * * *